US012704544B2

(12) United States Patent
Glasgow et al.

(10) Patent No.: US 12,704,544 B2
(45) Date of Patent: Aug. 11, 2026

(54) INDEPENDENT THERMAL CONTROLLER FOR MEMORY DEVICES AND DEVICE INTERFACE BOARDS

(71) Applicant: MICRON TECHNOLOGY, INC., Boise, ID (US)

(72) Inventors: Justin Glasgow, San Jose, CA (US); Brad Emberger, San Jose, CA (US); Kapil Ayyawar, San Jose, CA (US); Soma Tsuji, San Jose, CA (US); Joseph L. Tallarico, San Jose, CA (US); Manroop Turna, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 166 days.

(21) Appl. No.: 18/424,501

(22) Filed: Jan. 26, 2024

(65) Prior Publication Data

US 2024/0264221 A1 Aug. 8, 2024

Related U.S. Application Data

(60) Provisional application No. 63/531,792, filed on Aug. 9, 2023, provisional application No. 63/466,621, filed (Continued)

(51) Int. Cl.
*G01R 31/28* (2006.01)

(52) U.S. Cl.
CPC ..... *G01R 31/2849* (2013.01); *G01R 31/2862* (2013.01); *G01R 31/2877* (2013.01)

(58) Field of Classification Search
CPC ............ G01R 31/2834; G01R 31/2844; G01R 31/2889; G01R 31/2891; G01R 31/2872;

(Continued)

(56) References Cited

U.S. PATENT DOCUMENTS 5,315,240 A 5/1994 Jones
6,974,335 B1 12/2005 Podpora (Continued)

FOREIGN PATENT DOCUMENTS

WO 2009116735 A2 9/2009
WO 2018165601 A1 9/2018
WO 2018218168 A1 11/2018

OTHER PUBLICATIONS

Author N/A; Thermal Management for Testing High-Power IC Device Source: https://www.electronicdesign.com/home/article/21200761/thermal-management-for-testing-highpower-ic-devices; Publication Date: May 1, 2003.

(Continued)

*Primary Examiner* — Vinh P Nguyen
(74) *Attorney, Agent, or Firm* — Lowenstein Sandler LLP

(57) ABSTRACT

Systems and methods of independent thermal control of devices under test (DUTs) (e.g., memory devices) are disclosed herein. DUTs are coupled to dedicated cooling channels that include one or more controllable fans. The fans can be controlled independently according to temperature information of the DUTs, which is typically measured by an internal temperature sensor disposed in the DUTs. The fans of the cooling channels can be top-mounted (e.g., downdraft), bottom-mounted (e.g., updraft), or mounted on the front side of a DUT. Each cooling channel also has an exhaust channel on the front, top, and/or bottom of the channel for releasing heat. Advantageously, the air in the channel is guided by a shroud or cover placed over the DUT that can include internal vectored louvres, ridges, fins, ducts, chambers, etc., for directing air across surfaces of the DUT to evenly and efficiently cool the DUT during testing.

24 Claims, 20 Drawing Sheets

Related U.S. Application Data on May 15, 2023, provisional application No. 63/443,250, filed on Feb. 3, 2023.

(58) Field of Classification Search
CPC .......... G01R 31/2877; G01R 31/31905; G01R 31/2849; G01R 31/2862; G06F 1/206
See application file for complete search history.

(56) References Cited

U.S. PATENT DOCUMENTS

| | | | | |
|---|---|---|---|---|
| 7,355,428 | B2 | 4/2008 | Kabbani et al. | |
| 8,116,075 | B2 | 2/2012 | Hall et al. | |
| 8,274,300 | B2 | 9/2012 | Sakaue et al. | |
| 8,766,656 | B2 | 7/2014 | Malik et al. | |
| 9,784,789 | B2 | 10/2017 | Kikuchi et al. | |
| 9,968,009 | B2 | 5/2018 | Chen et al. | |
| 10,670,650 | B2 | 6/2020 | Wolff | |
| 10,670,651 | B2 | 6/2020 | Wolff | |
| 10,677,842 | B2 * | 6/2020 | Chen | G11C 29/56016 |
| 10,782,316 | B2 | 9/2020 | Tustaniwskyj | |
| 10,816,596 | B2 * | 10/2020 | Kim | G01R 31/2874 |
| 11,056,027 | B2 * | 7/2021 | Lee | H01L 23/3114 |
| 11,058,027 | B2 | 7/2021 | Artman et al. | |
| 11,099,228 | B2 * | 8/2021 | Su | G01R 31/2834 |
| 11,288,122 | B1 | 3/2022 | Fleisher et al. | |
| 11,754,622 | B2 * | 9/2023 | Akers | G01R 31/2891 324/750.08 |
| 2021/0127529 | A1 | 4/2021 | Hanna et al. | |
| 2021/0302469 | A1 | 9/2021 | Su | |
| 2021/0302501 | A1 | 9/2021 | Su et al. | |
| 2021/0303430 | A1 | 9/2021 | Yuan et al. | |
| 2022/0058097 | A1 | 2/2022 | Bautista | |
| 2022/0128625 | A1 | 4/2022 | Akers et al. | |
| 2022/0155364 | A1 | 5/2022 | Kabbani et al. | |
| 2022/0206061 | A1 | 6/2022 | Ranganathan et al. | |
| 2022/0214829 | A1 | 7/2022 | Bhullar et al. | |
| 2023/0054055 | A1 | 2/2023 | Milobinski et al. | |
| 2023/0060313 | A1 | 3/2023 | Phan et al. | |
| 2023/0168269 | A1 | 6/2023 | Wright | |
| 2025/0056755 | A1 * | 2/2025 | Glasgow | H05K 7/20209 |

OTHER PUBLICATIONS

Author N/A; Keysight Technologies B1505A Power Device Analyzer/Curve Tracer Source: https://www.keysight.com/us/en/assets/7018-02312/technical-overviews/5990-4654.pdf Publication Date: Jul. 21, 2014.

Wang; Concept Product—CP121 Discussions; Source: http://icydockforums.com/t/concept-product-cp121-discussions/1433; Publication Date: Jun. 2022.

Kennedy; E1 and E3 EDSFF to Take Over from M.2 and 2.5 in SSDs ; Source: https://www.servethehome.com/e1-and-e3-edsff-to-take-over-from-m-2-and-2-5-in-ssds-kioxia/2/; Publication Date: Jun. 29, 2021.

“3.5" HDD Enclosure with LCD display (USB + eSATA),” Brando, 2025, pp. 1-7. Retrieved from Online URL: https://usb.brando.com/3-5-hdd-enclosure-with-lcd-display-usb-esata-_p600c44d15.html.

“Orico USB-C NVMe M.2 SSD Enclosure Aluminum USB3.1 Gen2 10Gbps PCIe SSD Enclosure with Cooling Fan with LED Temperature Display M.2 Drive to Type-C External Storage Case Up to 4TB Grey-M2PX,” Amazon, 2025, pp. 1-8. Retrieved from Online URL: https://www.amazon.ca/ORICO-Enclosure-Aluminum-Temperature-Grey-M2PX/dp/B0895SCHXL.

* cited by examiner

INDEPENDENT THERMAL CONTROLLER FOR MEMORY DEVICES AND DEVICE INTERFACE BOARDS

CROSS-REFERENCE TO RELATED APPLICATION

The present application claims the benefit of and priority to: U.S. Provisional Patent Appl. No. 63/443,250 filed Feb. 3, 2023; U.S. Provisional Patent Appl. No. 63/466,621 filed May 15, 2023; and U.S. Provisional Patent Appl. No. 63/531,792 filed Aug. 9, 2023. The content of these applications are incorporated for all purposes herein as if set forth fully below.

FIELD OF THE INVENTION

Embodiments of the present invention generally relate to the field of device testing. More specifically, embodiments of the present invention relate to methods and systems for thermal management of a device under test (DUT).

BACKGROUND

A device or equipment under test is typically tested to determine the performance and consistency of the device before the device is sold. For example, a DUT can be tested using a large variety of test cases, and the result of the test cases can be compared to an expected output result. When the result of a test case does not match a satisfactory value or range of values, the device can be considered a failed device or outlier, and the device can be binned based on performance, etc.

A DUT is usually tested by automatic or automated test equipment (ATE), which may be used to conduct complex testing using software and automation to improve the efficiency of testing. The DUT may be any type of semiconductor device, wafer, or component that is intended to be integrated into a final product, such as a computer, network interface, or solid-state drive (SSD). By removing defective or unsatisfactory chips at manufacture using ATE, the quality of the yield can be significantly improved.

Testing a DUT typically involves performing some degree of thermal management to maintain DUT temperatures within an acceptable range, for example, so that the DUT does not overheat. Moreover, the quality and efficiency of testing multiple DUTs can be improved when testing multiple DUTs by maintaining consistent temperature between DUTs. For example, if one DUT is running at a significantly higher temperature than other DUTs during testing, the quality of testing is diminished due to the differences in temperature. Traditional approaches to thermal management for DUT testing rely on a bank or array of fans integrated into a rack-mounted interface operating at a relatively constant speed to cool multiple DUTs, which can lead to inconsistent temperatures across the devices. A more effective and granular approach to thermal management for testing multiple DUTs is desired.

SUMMARY

Accordingly, embodiments of the present invention provide systems and methods of independent thermal control for testing devices under test (DUTs) (e.g., memory devices). According to embodiments, DUTs are coupled to dedicated cooling channels that include one or more controllable fans. The fans can be controlled independently according to temperature information of the DUTs, which is typically measured by an internal temperature sensor disposed in the DUTs. The fans of the cooling channels can be top-mounted (e.g., downdraft), bottom-mounted (e.g., updraft), or mounted on the front side of a DUT. Each cooling channel also has an exhaust channel on the front, top, and/or bottom of the channel for releasing heat. Advantageously, the air in the channel is guided by a shroud or cover placed over the DUT that can include vectored louvres, internal ridges, fins, chambers, ducts, etc., for directing air across surfaces of the DUT to evenly and efficiently cool the DUT during testing, or during normal operation of the DUT, e.g., to maintain the DUT within a prescribed temperature range during normal operation for best-case performance.

According to one disclosed embodiment, a device interface board (DIB) for testing a device under test is disclosed. The DIB includes a temperature sensor board and a controller board. The temperature sensor board is operable to receive temperature information, and the controller board is operable to independently control the operation of a plurality of fans for cooling a plurality of devices under test (DUTs). The plurality of DUTs are coupled to the DIB.

According to some embodiments, the DIB further includes an LED bar that displays DUT status information according to the temperature information.

According to some embodiments, each DUT of the plurality of DUTs are disposed in shrouds that enclose the DUTs and guide air over surfaces of the DUTs to evenly cool the DUTs during testing.

According to some embodiments, the plurality of fans include two front-mounted fans for each DUT of the plurality of DUTs, and the front-mounted fans blow air that is exhausted out of at least one of: a top of the shrouds; and a bottom of the shrouds.

According to some embodiments, the shrouds include fins disposed on an interior surface of the shrouds to guide air across the surfaces of the DUTs.

According to some embodiments, the shrouds are plastic shrouds produced by a 3D printer.

According to some embodiments, the plurality of DUTs includes at least 16 DUTs.

According to some embodiments, the fans are independently controllable via the controller board according to the temperature information so that the DUTs reach a desired temperature.

According to some embodiments, the fans are independently controlled by the controller board according to the temperature information, and the temperature information includes internal DUT temperature sensor information.

According to some embodiments, the plurality of fans includes two bottom-mounted fans for each DUT of the plurality of DUTs that provide updraft airflow to cool the DUTs.

According to some embodiments, the plurality of fans includes two top-mounted fans for each DUT of the plurality of DUTs that provide downdraft airflow to cool the DUTs.

According to some embodiments, wherein the plurality of shrouds include respective internal vectored louvers operable to direct air along respective surfaces of the plurality of DUTs.

According to some embodiments, the plurality of DUTs include respective cooling fins disposed on the DUTs, and wherein the respective internal vectored louvers are operable to direct air along a length of the cooling fins.

According to some embodiments, the internal vectored louvers are operable to split air between different respective surfaces of the plurality of DUTs.

According to another embodiment, a method of thermal management for testing devices under test is disclosed. The method includes accessing temperature information of a plurality of DUTs, controlling a plurality of fans to cool the plurality of DUTs according to the temperature information, where each DUT of the plurality of DUTs is associated with at least one fan of the plurality of fans, and performing instructions of a test program to test the DUTs.

According to some embodiments, the method further includes illuminating an LED bar to display DUT status information according to the temperature information.

According to some embodiments, each DUT of the plurality of DUTs are disposed in shrouds that enclose the DUTs and guide air over surfaces of the DUTs to evenly cool the DUTs during testing.

According to some embodiments, the plurality of fans include two front-mounted fans for each DUT of the plurality of DUTs, and the front-mounted fans blow air that is exhausted out of at least one of: a top of the shrouds; and a bottom of the shrouds.

According to some embodiments, the shrouds include fins disposed on an interior surface of the shrouds to guide air across the surfaces of the DUTs.

According to some embodiments, the shrouds are plastic shrouds produced by a 3D printer.

According to a different embodiment, a method of thermal management for testing devices under test is disclosed. The method includes accessing temperature information of a plurality of DUTs, and controlling a plurality of fans using thermal control signals to cool the plurality of DUTs according to the temperature information using an independent thermal control (ITC) device interface board (DIB). The DIB includes a temperature sensor board operable to provide the temperature information, and a controller board operable to send and receive the thermal control signals.

According to some embodiments, the temperature sensor board is operable to receive temperature information form the plurality of DUTs, and the controller board is operable to independently control the operation of a plurality of fans for cooling the plurality of devices under test (DUTs). The plurality of DUTs are coupled to the ITC DIB.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Figure 14:
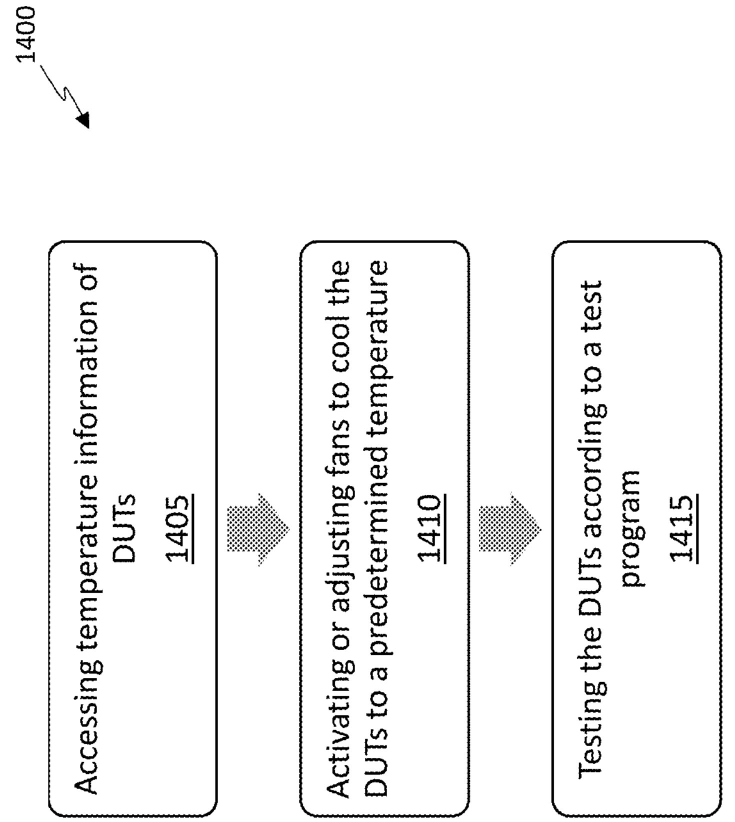
FIG. 14 is a flow chart depicting an exemplary sequence of steps of a computer controlled process for performing thermal management of devices under test according to embodiments of the present invention.

Portions of the detailed description that follows are presented and discussed in terms of a method (e.g., FIG. 14). Although steps and sequencing thereof are disclosed in a figure herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

Thermal Control for Memory Devices and Device Interface Boards with Independently Controllable Cooling Channels According to embodiments of the present invention, devices under test (DUTs) are coupled to a dedicated cooling channel that includes one or more controllable fans. The fans can be controlled independently (e.g., to turn the fan on or off, to adjust an RPM of the fan, etc.) according to temperature information of the DUTs, which is typically measured by an internal temperature sensor disposed in the DUTs.

The fans of the cooling channels can be top-mounted (e.g., downdraft), bottom-mounted (e.g., updraft), or mounted on the front side of a DUT. Each cooling channel also has an exhaust channel on the front, top, and/or bottom of the channel for releasing heat. Advantageously, the air in the channel is guided by a shroud or cover placed over the DUT that can include internal ridges, fins, ducts, chambers, etc., for directing air across surfaces of the DUT to evenly and efficiently cool the DUT during testing. For each channel, the air blown by the fans is controlled/manipulated through the duct/shroud and exits the channel and exhausts after cooling the DUT to a predetermined temperature. The DUTs can be inserted directly into the shrouds, or the shrouds can be closed/formed around the DUTs, according to embodiments.

A feedback control system using an on/off controller, a hysteresis band current controller, a proportional-integral-derivative controller (PID), or the like, controls and throttles each channel individually to ensure that the device operates at the desired temperature. The feedback control system can also enable DUTs to run at optimized temperatures, or can be set to enable thermal stress tests across some (or all) of the DUT channels at the same time. The control system can control the fans using pulse width modulation (PWM), and can interface with software of the tester system using parameter IDs (PIDs), for example.

According to some embodiments, compressed dry air (CDA) provides forced air to the cooling channels to cool the DUTs, with or without an air entrainment multiplier (e.g., an air amplifier), using a pressure regulator and air manifold, for example. The compressed air can be controllably released from the manifold using a variable proportional valve. According to other embodiments, the DUTs are cooled using piezoelectricity discharge (e.g., piezoelectric cooling), with or without an air entrainment multiplier (e.g., fans/blowers). According to some embodiments, the DUTs are SSDs disposed within an external hard drive enclosure that includes a cooling channel and a thermal feedback control system.

Figure 1:
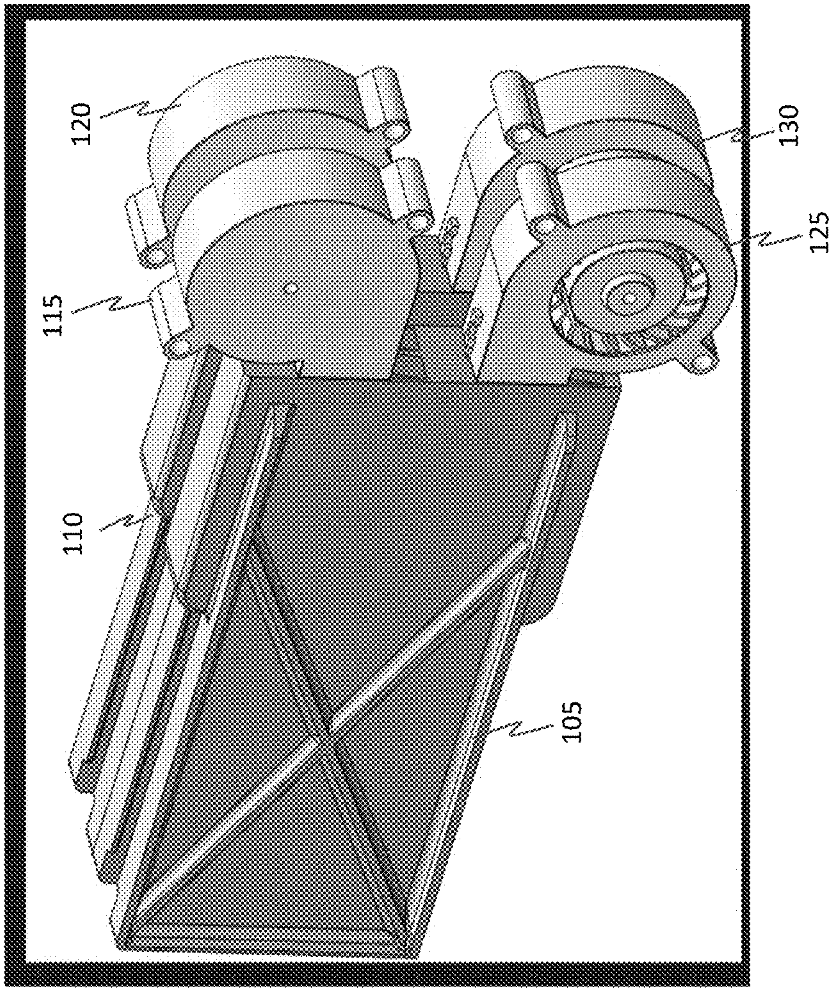
FIG. 1 is a diagram depicting exemplary DUT shrouds with front-mounted fans according to embodiments of the present invention.

FIG. 1 is a diagram depicting exemplary DUT shrouds 105, 110 with front-mounted fans 115, 125 and 120, 130, respectively, according to embodiments of the present invention. A DUT is enclosed in each shroud 105, 110 with two front mounted fans that blow air over the DUT to achieve a desired temperature under the control of an independent thermal controller (ITC) device (e.g., a device interface board). The ITC device is typically operable to send and/or receive thermal control signals and thermal information (e.g., temperature, fan speed, humidity, etc.) The shrouds 105, 110 can include fins, ducts, or louvres that guide the blown air over the surfaces of the enclosed DUT to effectively cool the DUT in a controllable manner based on temperature measurements of the DUT. According to some embodiments, internal vectored louvers are placed inside shrouds 105, 110 to guide the air over a specific surface or surfaces of the enclosed DUT, or to change a direction that the air flows over a surface of the DUT, such as in the direction of (e.g., parallel to) fins of a heatsink. The temperature measurements can be taken by an internal temperature sensor of the DUT. The shrouds 105, 110 can be made of plastic and can be produced, printed, and/or customized by a 3D printer as one unified piece, or as multiple separate pieces that are joined together, for example.

Figure 2:
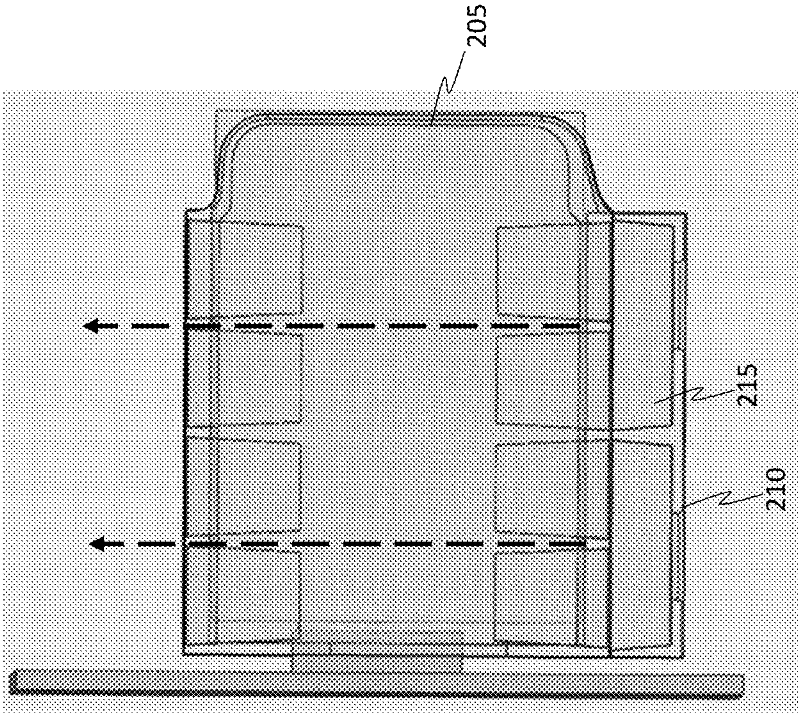
FIG. 2 is a diagram depicting an exemplary DUT shroud with bottom-mounted fans according to embodiments of the present invention.

FIG. 2 is a diagram depicting an exemplary DUT shroud 205 with bottom-mounted fans 210, 215 according to embodiments of the present invention. The shroud 205 can include multiple chambers (e.g., 2 chambers) that build and contain backpressure as a result of the forced air produced by fans 210, 215. In the example of FIG. 2, the fans 210, 215 blow air upwards across the surfaces of the enclosed DUT, and the air is advantageously guided by the shroud to evenly cool the DUT. Moreover, hot air is exhausted from the top end of shroud 205 in this example. The fans can be controlled to automatically cool the DUT until a desired temperature is reached, or to enable the DUT to run at optimized temperatures as directed by an ITC device (e.g., DIB).

Figure 3:
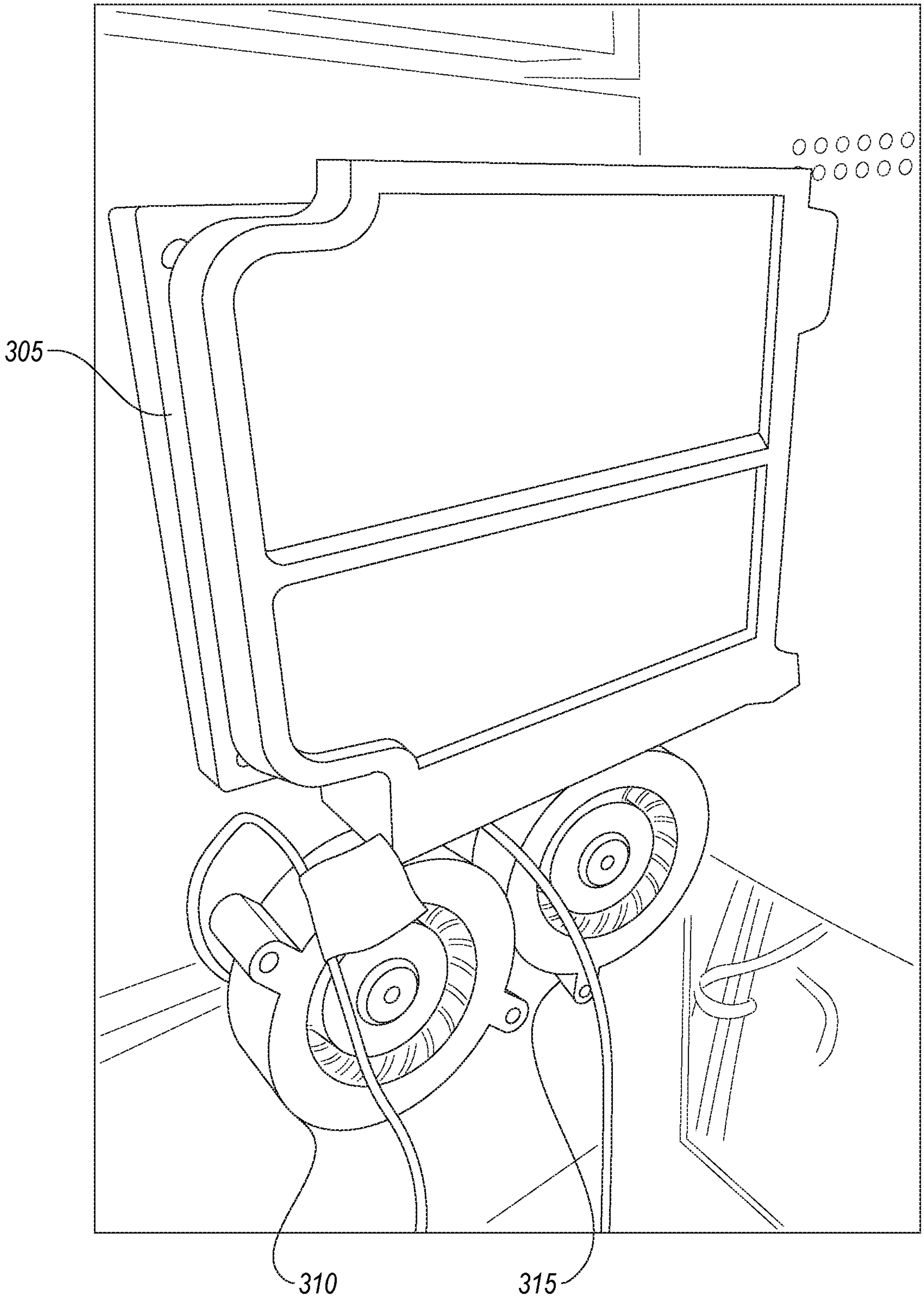
FIG. 3 is a diagram depicting an exemplary DUT shroud with bottom-mounted fans configured for loop-back testing according to embodiments of the present invention.

FIG. 3 is a diagram depicting an exemplary DUT shroud 305 with bottom-mounted fans 310, 315 configured for loop-back testing according to embodiments of the present invention. In the example of FIG. 3, the enclosed DUT cooled by fans 310, 315 is connected to an interface of a loop-back test system. After the DUT has been tested, a new DUT can be inserted into DUT shroud 305 for testing. In this example, air is forced upward over the surfaces of the enclosed DUT and the hot air exhausts out of the top of DUT shroud 305.

Figure 4:
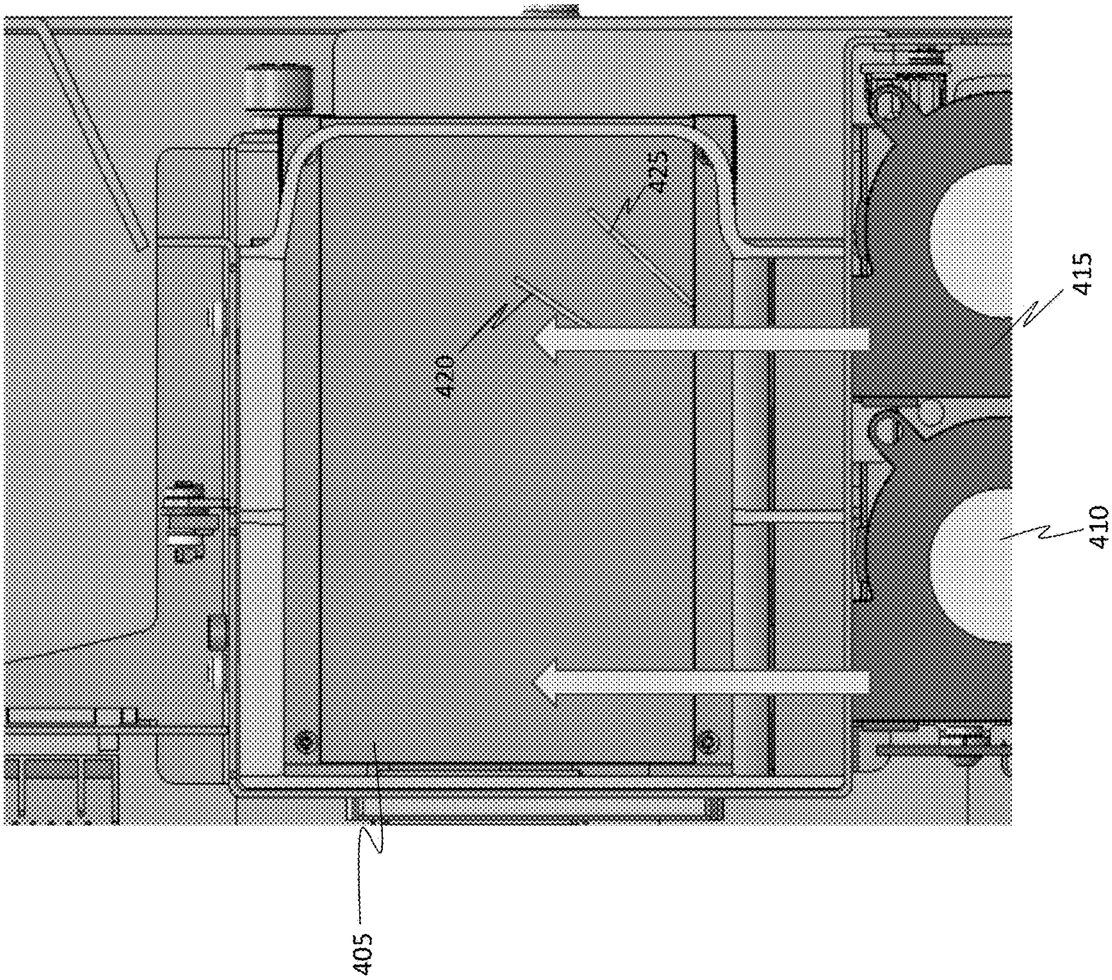
FIG. 4 is a diagram depicting an exemplary DUT shroud with bottom-mounted fans and two fins that guide air for even distribution across the surfaces of the DUT according to embodiments of the present invention.

FIG. 4 is a diagram depicting an exemplary DUT shroud 405 with bottom-mounted fans 410, 415 and two fins 420, 425 that guide air for even distribution across the surfaces of the DUT according to embodiments of the present invention. In the example of FIG. 4, bottom-mounted fans 410, 415 blow air upwards over the surfaces of the enclosed DUT, and the hot air exhausts out of the top of DUT shroud 405. Advantageously, fins 420, 425 are positioned to guide the air in a way that directs cooling over the DUT surface for improved cooling performance. Fins 420, 425 can be positioned at any location on DUT shroud 405 using an orientation that improves cooling, or to target specific hotspots or surfaces of the DUT, for example.

Figure 5:
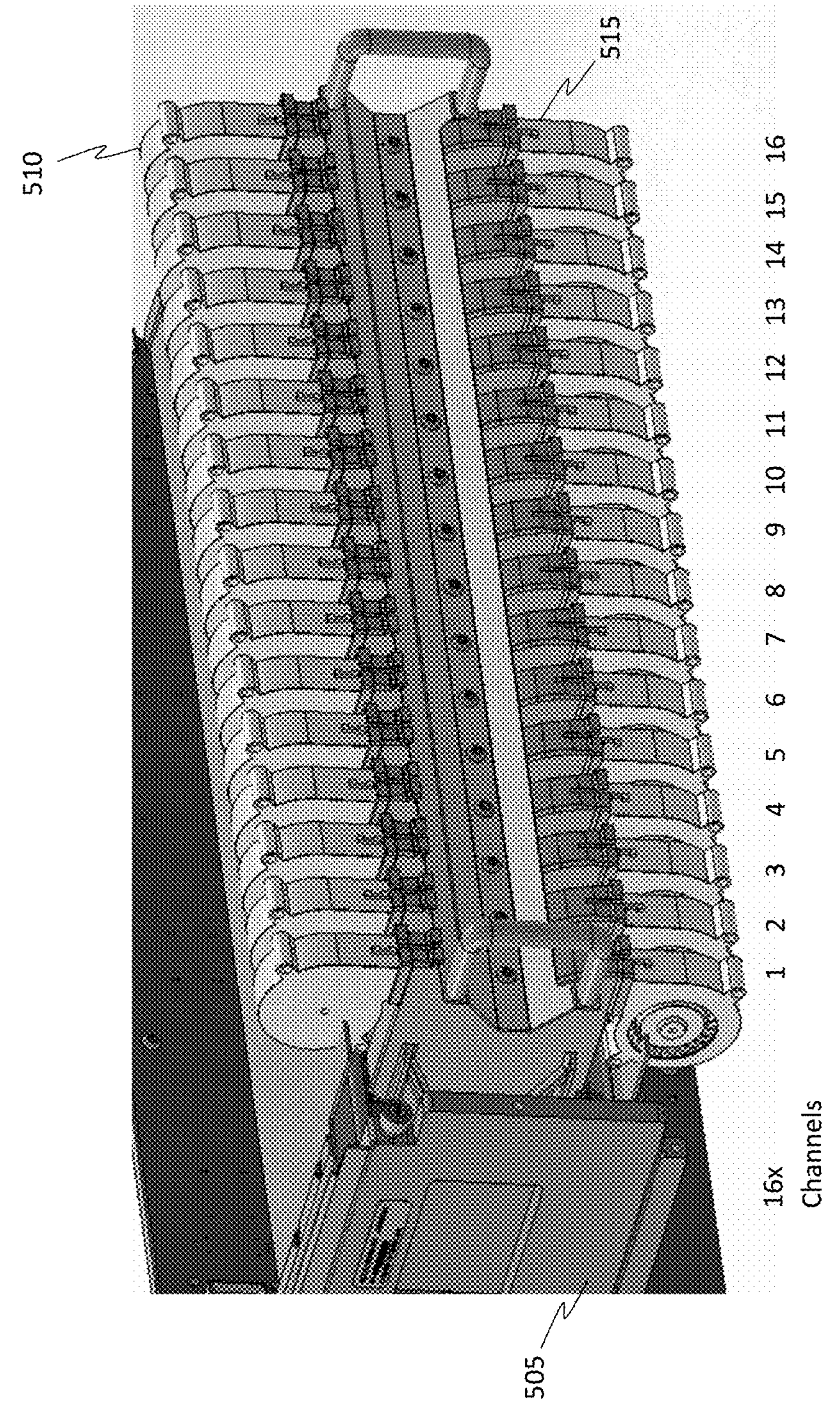
FIG. 5 is a diagram depicting 16 exemplary DUTs enclosed by DUT shrouds installed on a device interface board for improved cooling during testing according to embodiments of the present invention.

FIG. 5 is a diagram depicting 16 exemplary DUTs enclosed by DUT shrouds installed on a device interface board 505 for improved cooling during testing according to embodiments of the present invention. In the example of FIG. 5, each of the 16 DUTs are cooled by an independently controllable cooling channel using top-mounted fans 510 and bottom-mounted fans 515. The fans of each channel can be throttled individually to ensure that the devices operate at a desired temperature, or can be set to enable thermal stress tests across some or all of the cooling channels at the same time, for example. In this way, thermal testing can be performed on a more granular level, with each DUT being independently monitored and temperature controlled for testing purposes using DIB 505.

Figure 6:
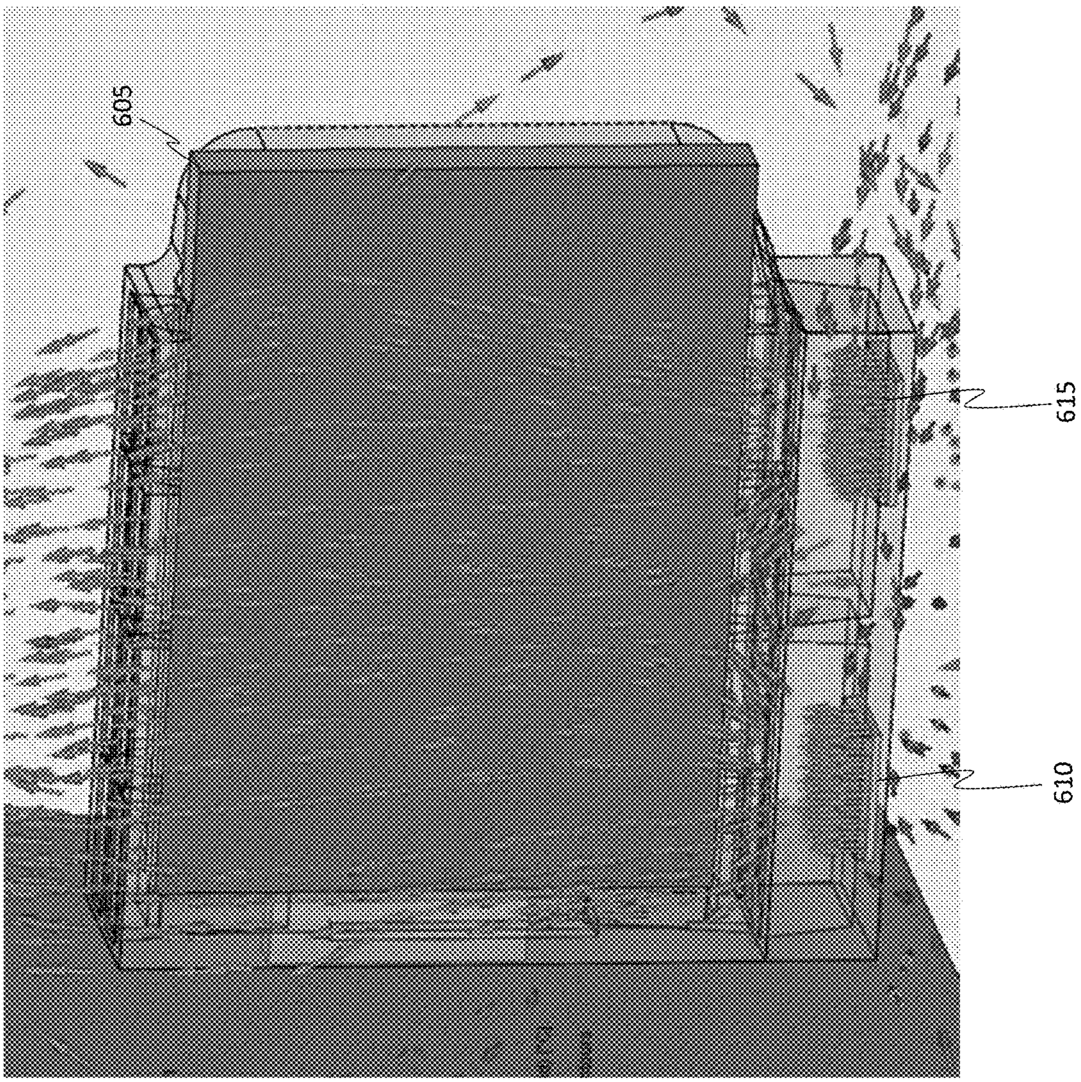
FIG. 6 is a diagram depicting thermal conditions and air flow of an exemplary DUT disposed within a DUT shroud with bottom-mounted fans according to embodiments of the present invention.

FIG. 6 is a diagram depicting thermal conditions and air flow of an exemplary DUT disposed within a DUT shroud 605 with bottom-mounted fans 610, 615 according to embodiments of the present invention. As depicted in FIG. 6, air is forced upwards by fans 610, 615 and the air flows over the surfaces of the DUT to cool the DUT during use or testing. Hot hair (exhaust) flows out of the top of the DUT shroud 605 after cooling the DUT. The fans can be controlled independently based on the thermal conditions of the DUT, for example, as determined by an internal temperature sensor connected to a temperature sensor board, and the air can be guided by fins disposed within DUT shroud 605, according to embodiments. As depicted in the example of FIG. 6, the air spreads out over the surface of the DUT enclosed by DUT shroud 605 to provide even and effective cooling of the enclosed DUT.

Figure 7:
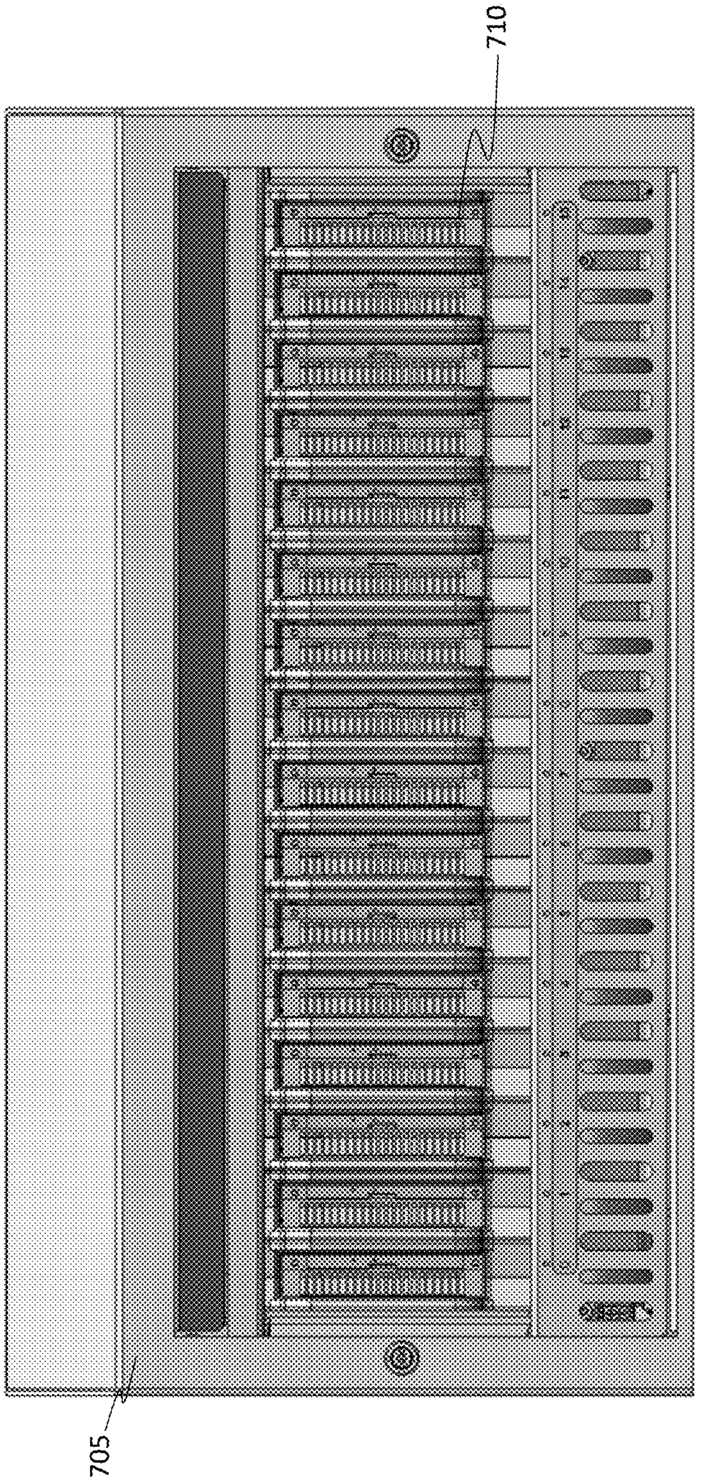
FIG. 7 is a diagram of an exemplary ITC DIB with 16 individual cooling channels and 16× loopback DUTs installed on the DIB and disposed inside of shrouds for testing according to embodiments of the present invention.

FIG. 7 is a diagram of an exemplary ITC DIB 705 with 16 individual cooling channels and 16× loopback DUTs 710 installed on DIB 705 and disposed inside of shrouds for testing according to embodiments of the present invention. The fans of the cooling channels are visible through the front vents which allow air to enter the shrouds. The hot air can be exhausted out of the back of the ITC DIB 705. Each of the 16 individual cooling channels is associated with a specific DUT 710, and the cooling channels can be monitored and controlled independently based on the test being conducted. For example, each DUT 710 can be selectively stress tested or cooled to a specific temperature or temperature range, according to embodiments. According to some embodiments, ITC DIB 705 includes 32 individual cooling channels for testing 32× loopback DUTs 710 installed on the DIB 705.

Figure 8:
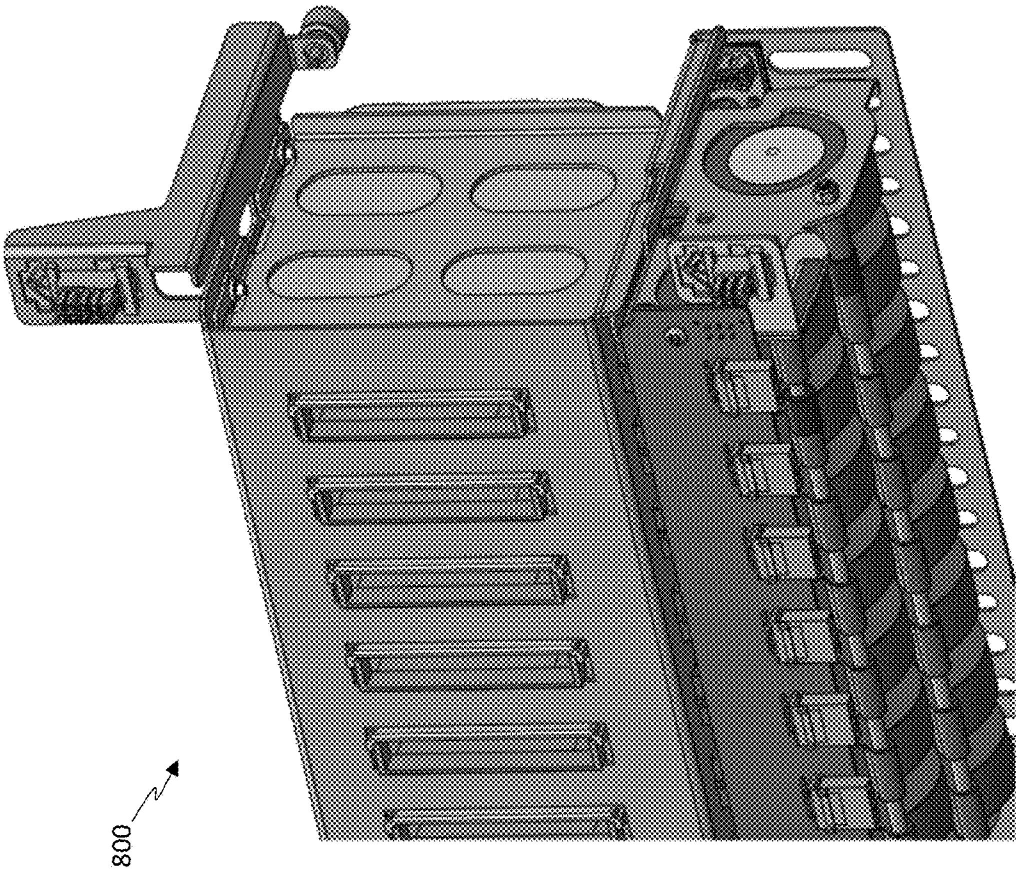
FIG. 8 is a diagram depicting an isometric view of an exemplary 16 channel ITC cartridge assembly with onboard hardware according to embodiments of the present invention.
Figure 9:
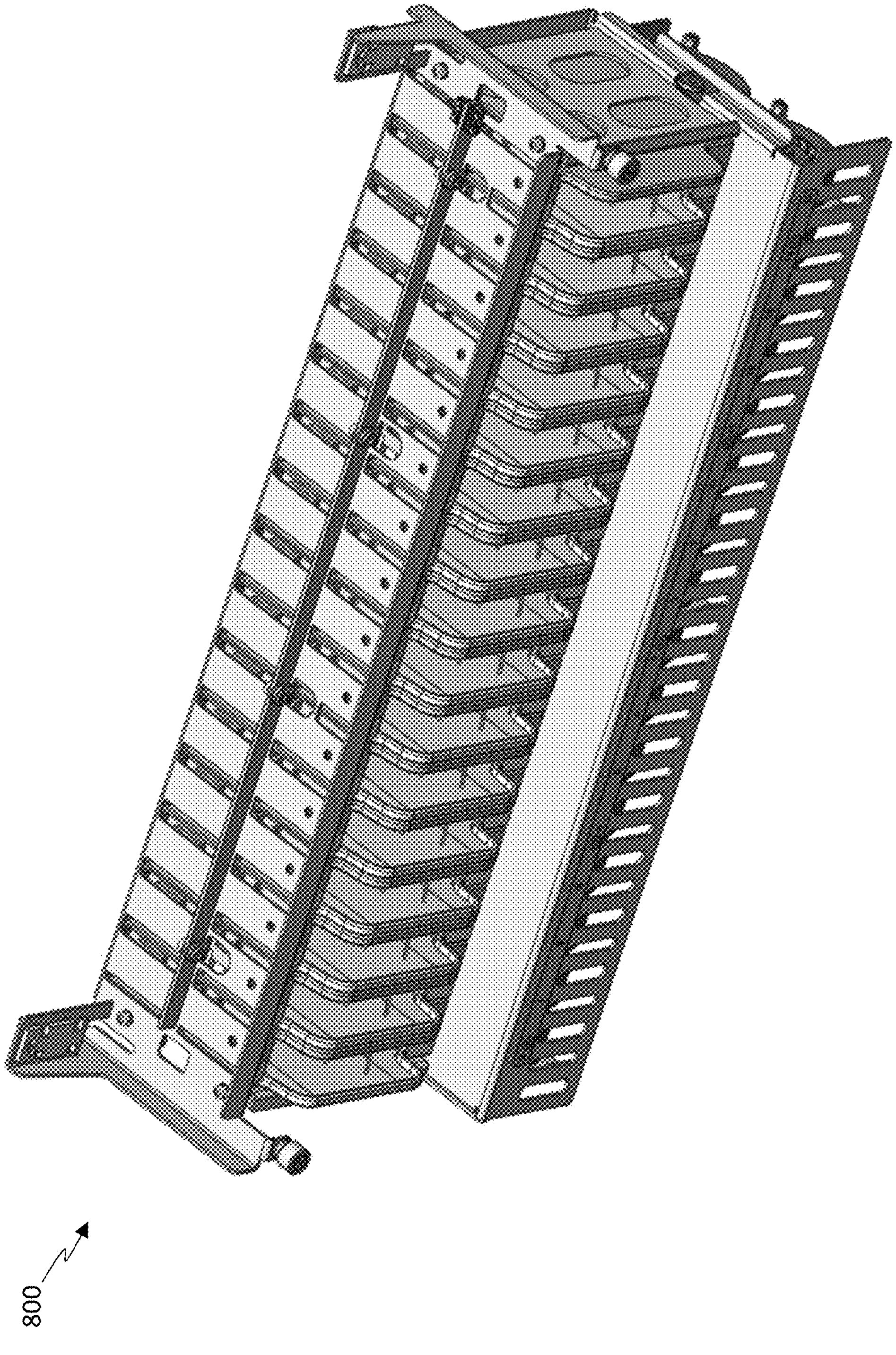
FIG. 9 is a diagram depicting another isometric view of an exemplary 16 channel ITC cartridge assembly with onboard hardware according to embodiments of the present invention.

FIG. 8 and FIG. 9 are diagrams depicting isometric views of an exemplary 16 channel ITC cartridge assembly 800 with onboard hardware according to embodiments of the present invention. Several DUTs (enclosed in DUT shrouds) can be installed on the ITC cartridge assembly 800, and the ITC cartridge assembly 800 with the enclosed DUTs can be inserted into ITC DIB 705 depicted in FIG. 7 for DUT testing using independent thermal control. Each DUT can be cooled and monitored independently, and the DUT shrouds provide efficient cooling over the surfaces of the DUTs.

Figure 10A:
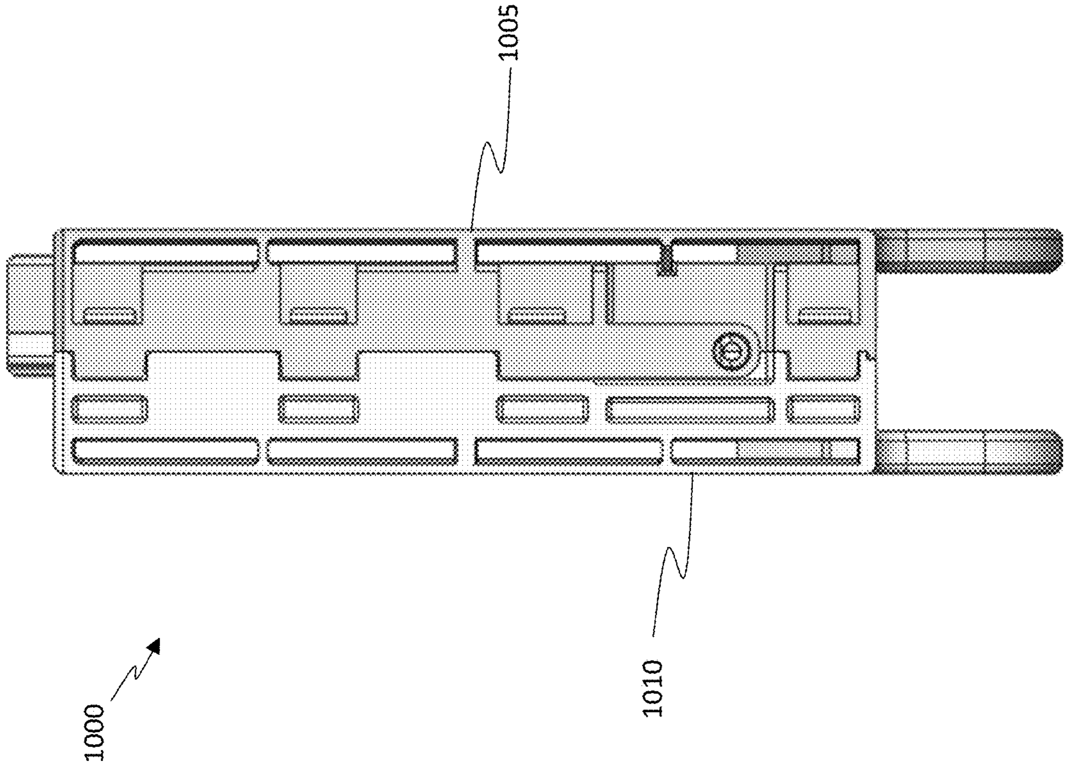
FIG. 10A is a diagram of the top of an exemplary DUT shroud that includes two components that can be produced separately (e.g., 3D printed) and connected together (e.g., snapped or fitted together using tension) to form an enclosure according to embodiments of the present invention.
Figure 10B:
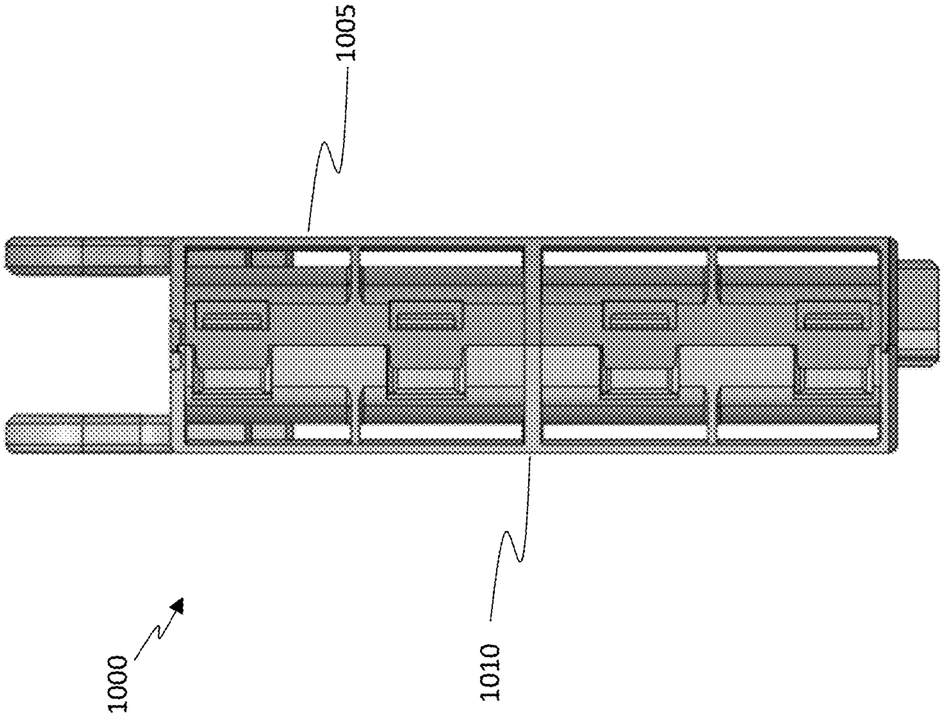
FIG. 10B is a diagram of the bottom of the exemplary DUT shroud depicted in FIG. 10A according to embodiments of the present invention.

FIG. 10A is a diagram of the top of an exemplary DUT shroud 1000 that includes two components that can be produced separately (e.g., 3D printed) and connected together (e.g., snapped or fitted together using tension) to form an enclosure according to embodiments of the present invention. The enclosure 1000 is designed to securely enclose DUTs of a specific form factor, and to allow blown air to pass over the surfaces of the DUT and exhaust out of the enclosure. FIG. 10B is a diagram of the bottom of the exemplary DUT shroud 1000 depicted in FIG. 10A according to embodiments of the present invention. Fans can be installed on the bottom portion of the DUT shroud 1000 to force air upward over the surfaces of a DUT enclosed in the DUT shroud 1000 for efficient thermal management under the control of an ITC device (e.g., ITC DIB 705).

Figure 11:
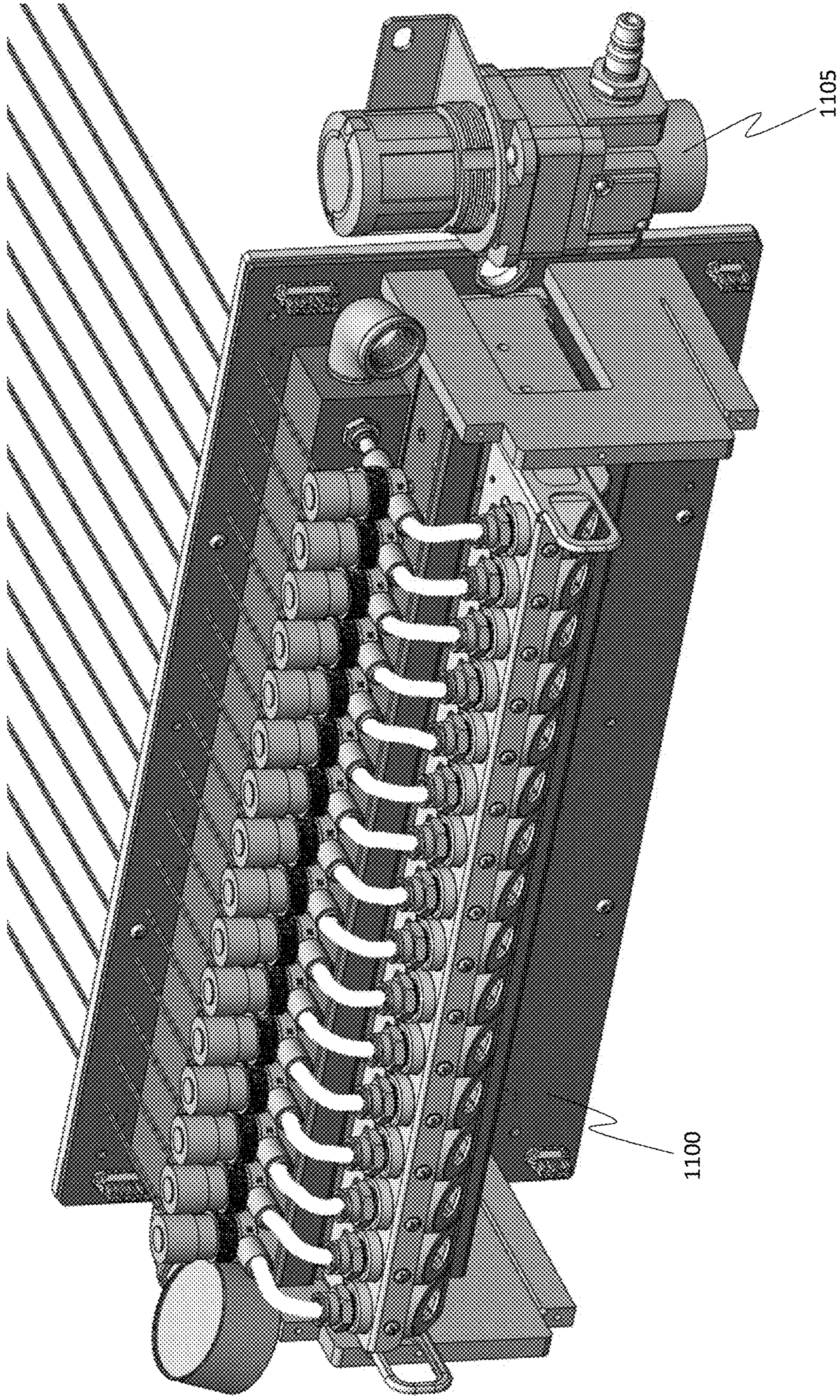
FIG. 11 is a diagram of exemplary DUTs installed on a DIB and cooled using a compressed dry air manifold without using an air entrainment multiplier according to embodiments of the present invention.

FIG. 11 is a diagram of exemplary DUTs installed on a DIB 1100 and cooled using a compressed dry air (CDA) manifold 1105 without using an air entrainment multiplier according to embodiments of the present invention. The DUTs are disposed within DUT shrouds that enclose the DUTs and direct air over the surfaces of the DUTs for efficient cooling as controlled by an ITC device (e.g., DIB 1100).

Figure 12:
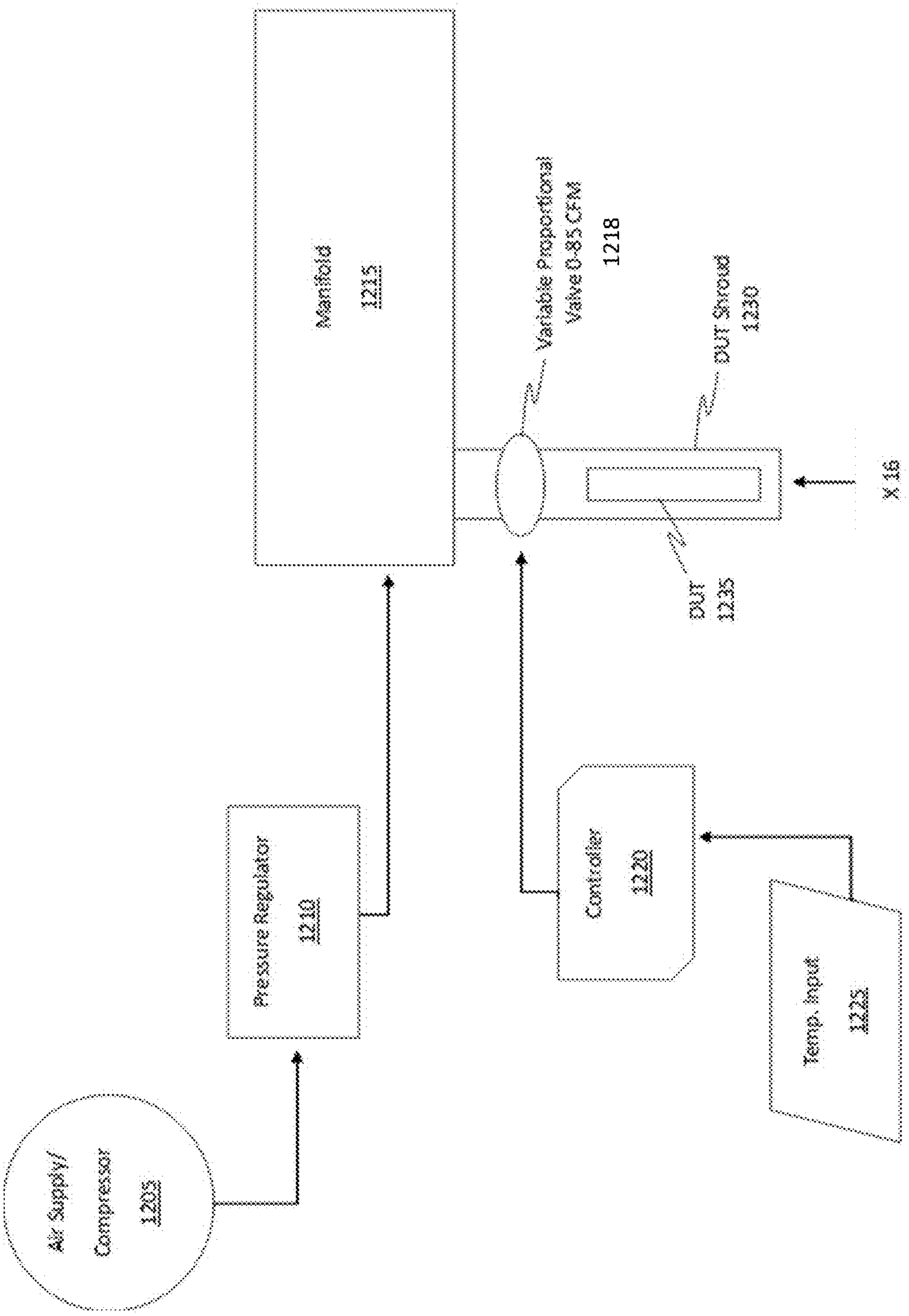
FIG. 12 is a block diagram of an exemplary independent thermal management system for independently cooling a DUT disposed in a DUT shroud using an air supply or compressor that provides forced air for cooling according to embodiments of the present invention.

FIG. 12 is a block diagram of an exemplary independent thermal management system 1200 for independently cooling a DUT 1235 disposed in a DUT shroud 1230 using an air supply or compressor (e.g., CDA) 1205 that provides forced air for cooling according to embodiments of the present invention. Air from the air supply or compressor 1205 is provided to a pressure regulator 1210 that feeds air to a manifold 1215 at a predetermined pressure, and the air provided to the manifold 1215 is controllably released by a variable proportional valve 1218 coupled to an electronic controller 1220 (e.g., a controller board) that activates (e.g., opens/closes) the valve 1218 based on temperature input (e.g., input from a DUT temperature sensor). Manifold 1215 is typically disposed on a cartridge assembly or DUT shroud 1230 that encloses the DUT and guides the air provided by the manifold over the surfaces of the DUT for efficient cooling and independent thermal control. Any number of DUTs 1235 (e.g., 1-32) can be cooled and tested concurrently using the air provided by the air supply/compressor 1205, and the different DUTs can be monitored and cooled independently. For example, controller 1220 can controllably release air from air supply/compressor 1205 by manipulating variable proportional valve 1218 according to thermal requirements of a test program carried out by an ITC for testing the DUTs.

Figure 13:
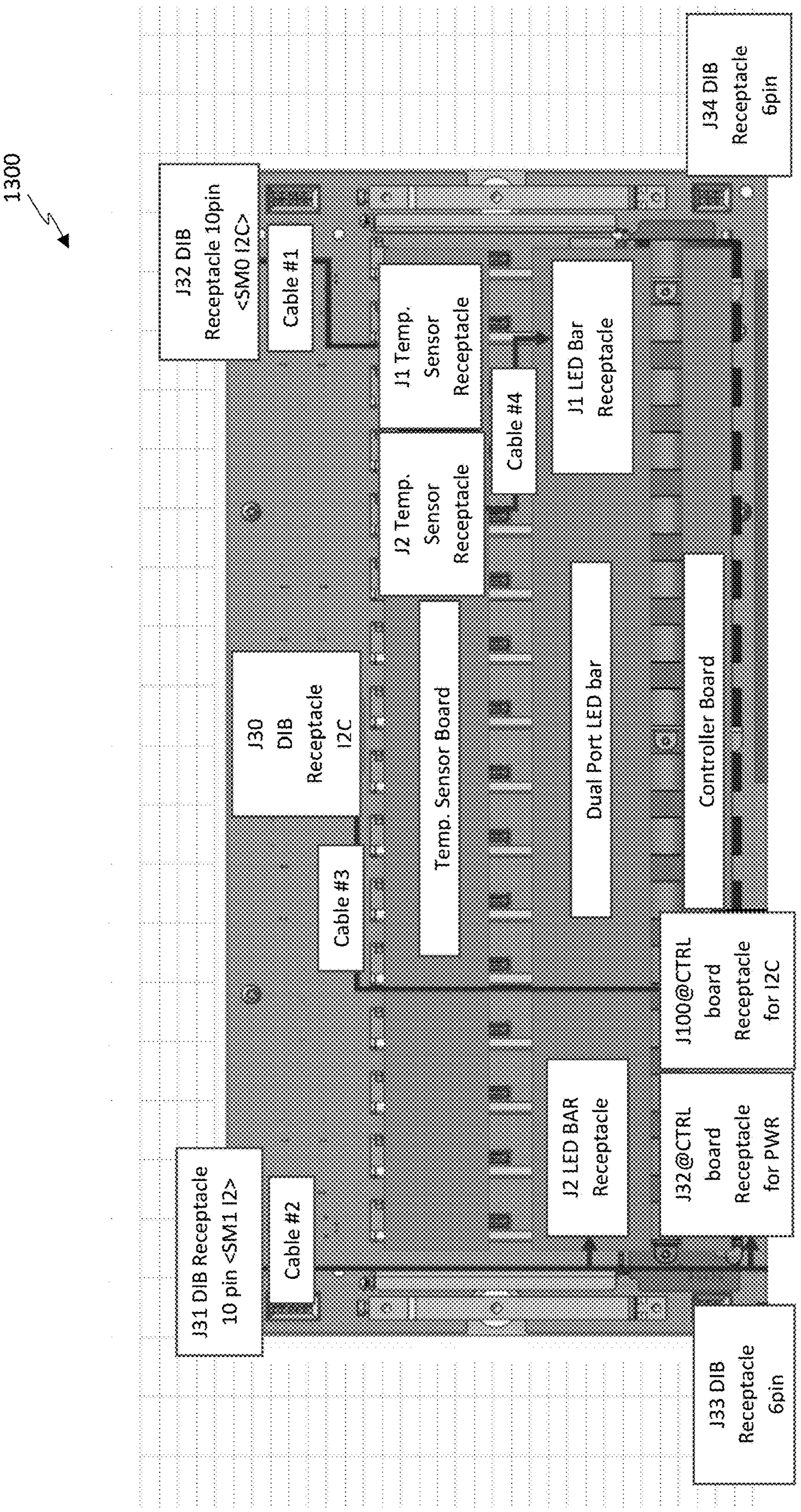
FIG. 13 is a wiring diagram of an exemplary ITC DIB according to embodiments of the present invention.

FIG. 13 is a wiring diagram of an exemplary ITC DIB 1300 according to embodiments of the present invention. ITC DIB 1300 can perform thermal management of multiple devices using independent cooling channels so that each connected DUT can reach or maintain a desired temperature, for example. The ITC DIB includes an interconnected temperature sensor board, LED bar, and controller board for performing independent thermal management of the DUTs. In the example of FIG. 13, cable 1 connects 10-pin DIB receptacle J32 to Temperature Sensor Receptacle J1 for transmitting temperature information to the DIB. Cable 2 connects 10-pin DIB receptacle J31 to LED bar receptacle J2 for displaying status information of DUTs by illuminating one or more LEDs, to controller board receptacle J32 for supplying power to the controller board, and to 6-pin DIB receptable J33. Cable 3 connects DIB receptable J30 to controller board inter-Integrated Circuit (I2C) receptacle J100. Cable 4 connects temperature sensor receptacle J2 to LED bar receptacle J1 for displaying temperature related information using the LED bar. Fewer or additional cables may be used according to other embodiments.

FIG. 14 is a flow chart depicting an exemplary sequence of steps of a computer controlled process 1400 for performing thermal management of devices under test according to embodiments of the present invention. Thermal management can be performed by an ITC DIB, for example, and can include controlling fans that force air into cooling channels that guide air over surfaces of the DUTs to achieve a desired temperature. The air is guided evenly over the surfaces to avoid hotspots or overheating.

At step 1405, temperature information of the DUTs is accessed from the DUTs or from a temperature control board connected to the DUTs, for example. The temperature information can include measurements taken from internal temperature sensors of the DUTs according to embodiments.

At step 1410, fans are activated or adjusted (e.g., the RPM of the fans is increased or decreased) to blow air over surface of the DUTs based on the temperature information. The air is guided by cooling channels of DUT shrouds that surround and encloses each DUT. According to some embodiments, the fans are controlled to perform stress testing of the DUTs under specific conditions (e.g., under high heat).

At step 1415, instructions of a test program are performed to test the DUTs under adequate thermal conditions.

Although the method steps are described in conjunction with the systems of FIGS. 1-13, persons of ordinary skill in the art will understand that any system configured to perform the method steps, in any order, is within the scope of the present disclosure.

Device Cooling Using Air Vectoring to Guide Air Over Device Surface

According to some embodiments of the present invention, air is guided over a specific surface or surfaces of a device under test using novel air vectoring techniques. Air vectoring is especially useful when the DUT is disposed in a DUT shroud at an orientation that prevents air from reaching the surfaces of the DUT that particularly need to be cooled, or when the surfaces are more efficiently cooled from a certain direction. For example, some DUTs have form factors that use heat sink fins mounted on the DUT perpendicular to the direction of air flow when a top-to-bottom or bottom-to-top air flow orientation is employed. In these cases, it is often advantageous to move air along the length of the heat sink fins to enhance cooling and aerodynamics while at the same time avoiding exhausting hot air toward the user. Therefore, according to some embodiments, air blown by a top-mounted fan is collected by or guided into a diffuser chamber, which is channeled via an external passage toward the side of the DUT shroud. According to some embodiments, the DUT shrouds include vectored louvres that redirect incoming air along the length of the DUT heat sink and rearward toward the back of the DUT, for example. Additional ducting can be added to vector the exhaust in any direction desired, for example, based on the orientation of the DUT, the location and direction of any heat fins, etc.

Figure 15:
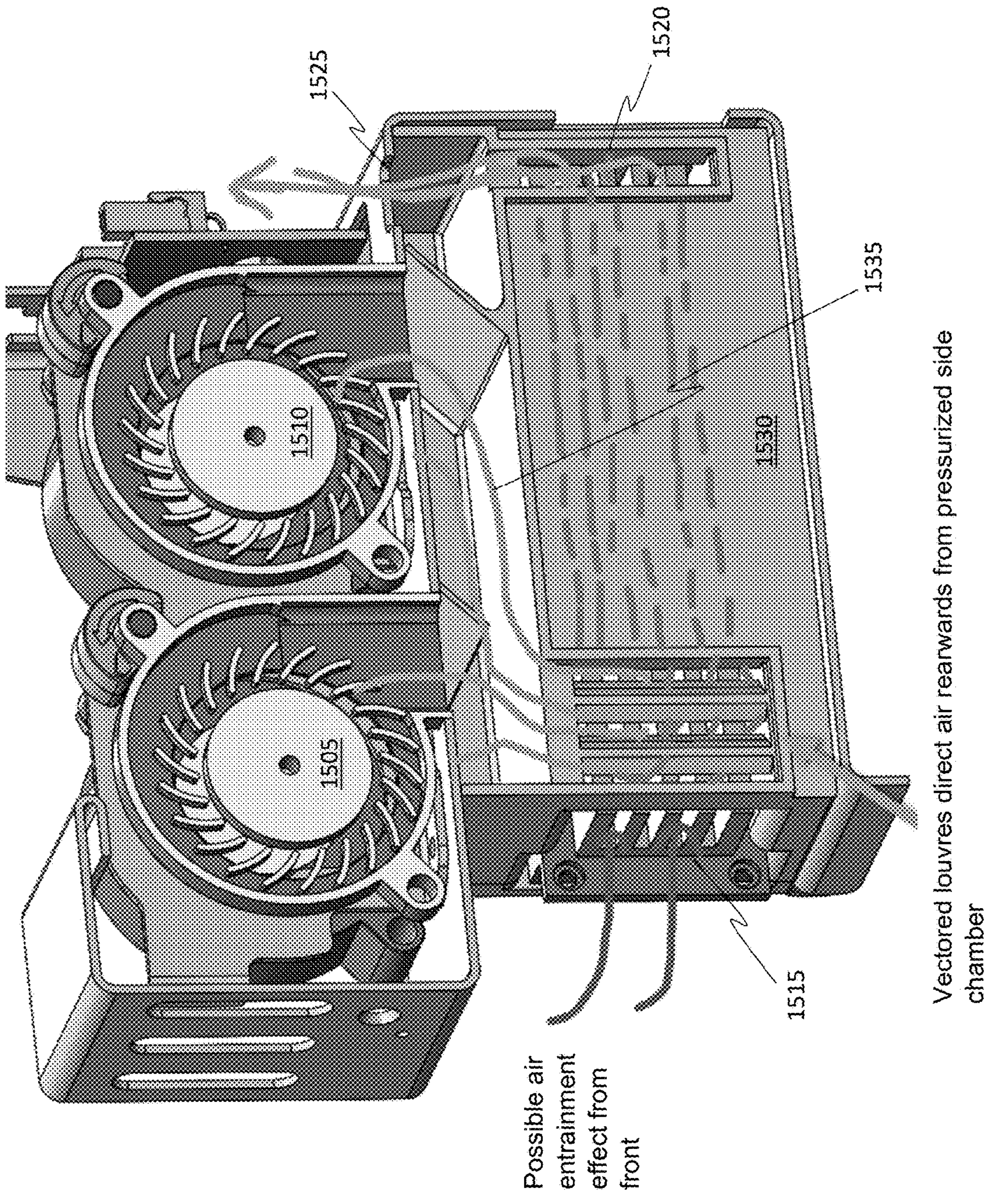
FIG. 15 depicts an exemplary DUT shroud with top-mounted fans for blowing air downward into an upper chamber using air vectoring to guide the air along a specific surface of the enclosed DUT according to embodiments of the present invention.

FIG. 15 depicts an exemplary DUT shroud 1530 with top-mounted fans 1505 and 1510 for blowing air downward into an upper chamber 1535 using air vectoring to guide the air along a specific surface of the enclosed DUT according to embodiments of the present invention. In the example of FIG. 15, upper chamber 1535 collects air from fans 1505 and 1510, although more fans (e.g., 4 fans) can be used depending on air/cooling requirements. Air is ported from upper chamber 1535 to the front right side of DUT shroud 1530 using louvres, and also vectored rearward to run along length of the cooling fins disposed on the surface of the enclosed DUT. Air can be entrained from a port or opening 1515 on the front side of the DUT to further enhance cooling.

Side exhaust port 1520 on the right-hand rear of shroud collects heated air and exhausts air upward to top exhaust port 1525 from the pressurized side chambers, although different exhaust locations can be used (e.g., rear, right side, top, or bottom). It should be noted that in the embodiment depicted in FIG. 15, the air only cools the right-hand side (the heat sink side) of the enclosed DUT. To cool both sides, slits can be added on the left half of the upper chamber to allow some of the air to pass over to the left-hand side of the enclosed DUT.

Figure 16A:
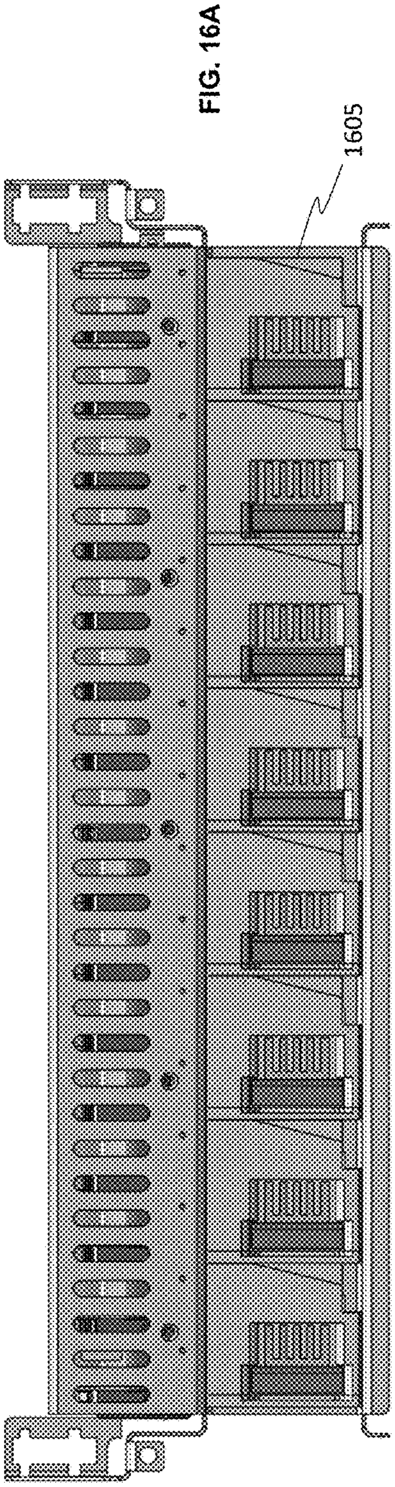
FIGS. 16A and 16B depict 16 exemplary DUTs enclosed by DUT shrouds installed on a device interface board for testing according to embodiments of the present invention.
Figure 16B:
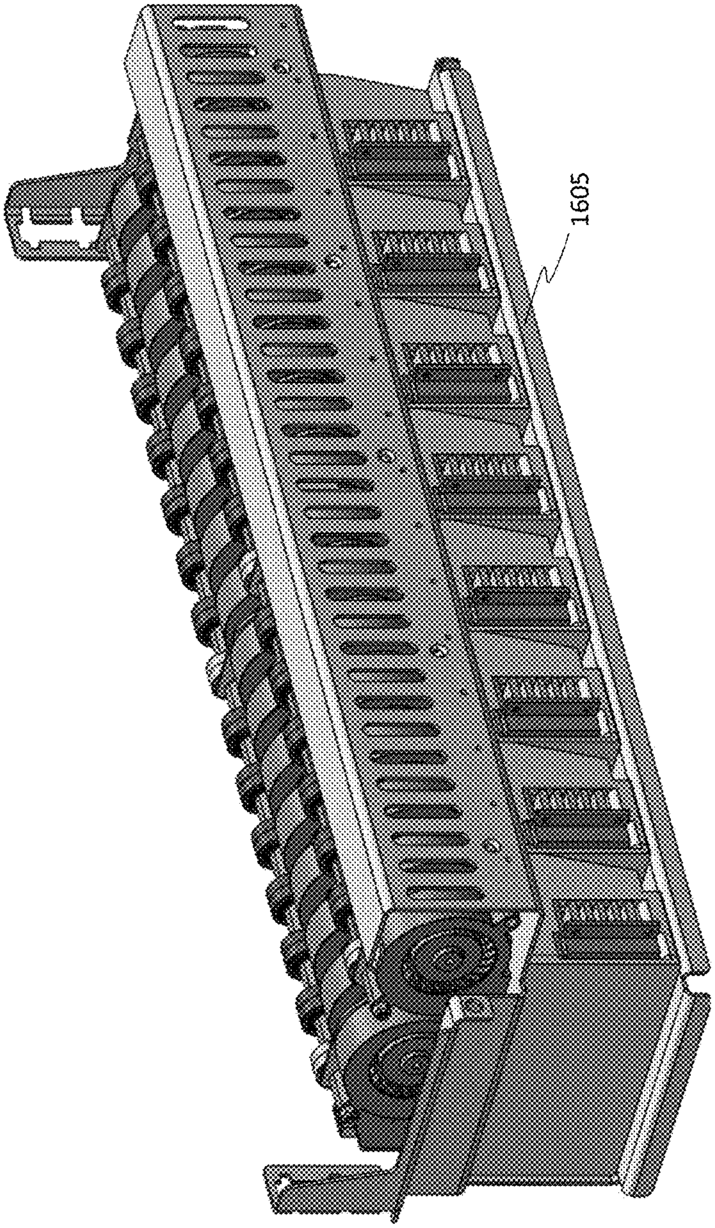

FIGS. 16A and 16B depict 16 exemplary DUTs enclosed by DUT shrouds installed on a device interface board 1605 for testing according to embodiments of the present invention. 16 DUTs can be tested concurrently using independently controllable cooling channels, and air vectoring can be used to guide the air along specific surfaces of the DUTs and/or in a specific direction to enhance cooling. For example, each DUT can be enclosed by a DUT shroud that includes internal vectored louvers that direct air over a specific surface or surfaces of the DUTs and at specific directions relative to the DUTs (e.g., relative to heat sink fins of the DUTs).

Figure 17:
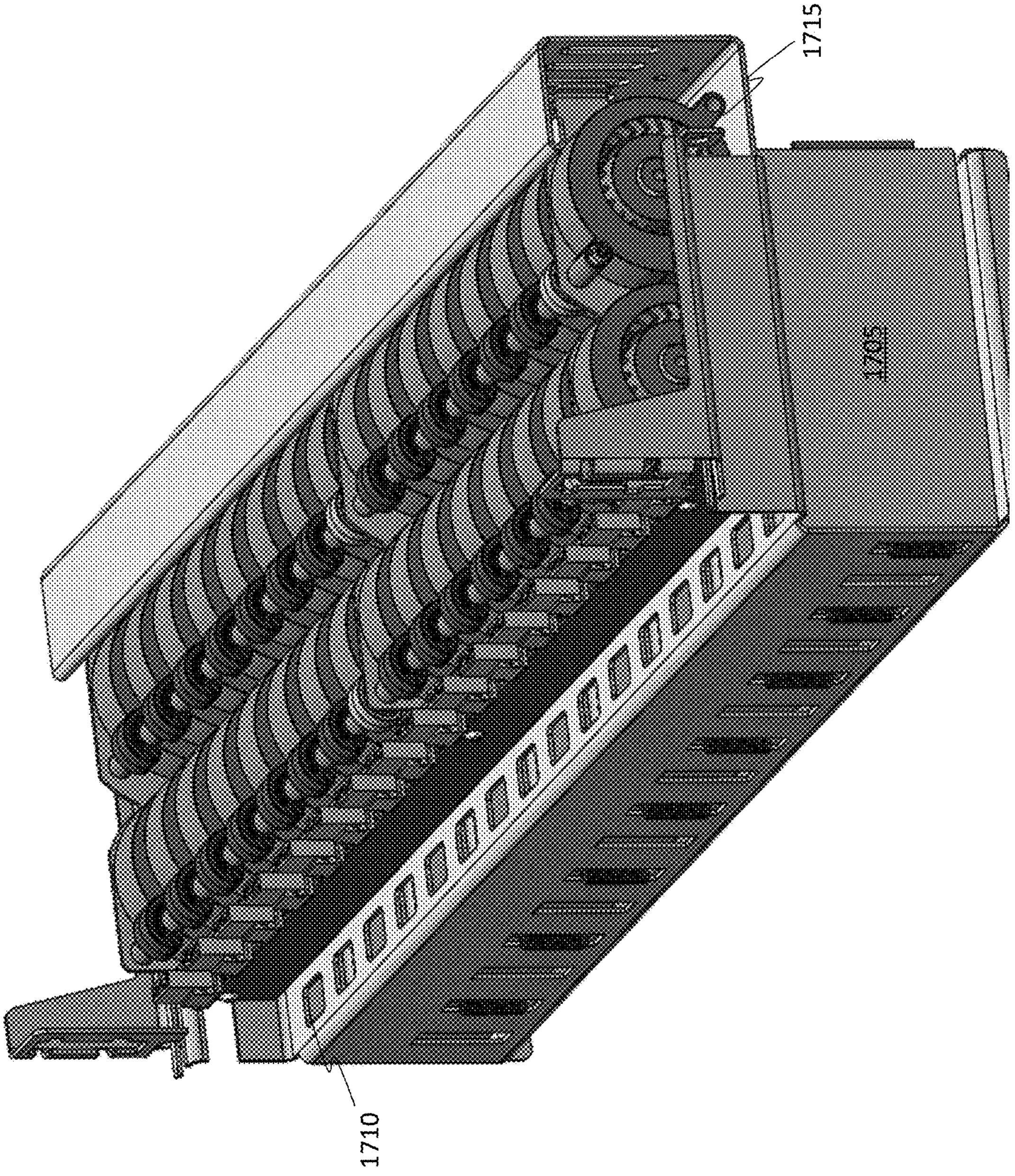
FIG. 17 depicts exemplary DUTs enclosed by DUT shrouds installed on a device interface board for testing according to embodiments of the present invention.

FIG. 17 depicts exemplary DUTs enclosed by DUT shrouds installed on a device interface board 1705 for testing according to embodiments of the present invention. In the example of FIG. 17, each of the 16 DUTs are cooled by an independently controllable cooling channel using top-mounted fans 1715. The fans 1715 of each channel can be throttled individually to ensure that the devices operate at a desired temperature, or can be set to enable thermal stress tests across some or all of the cooling channels at the same time, for example. Moreover, vectored louvers disposed within the DUT shrouds can direct air along a specific surface or surfaces of the DUTs and in a specific direction, for example, along the length of cooling fins disposed on the DUTs. Upward exhaust ports 1710 allow hot air to escape upwards without being blown forward at the user.

Figure 18A:
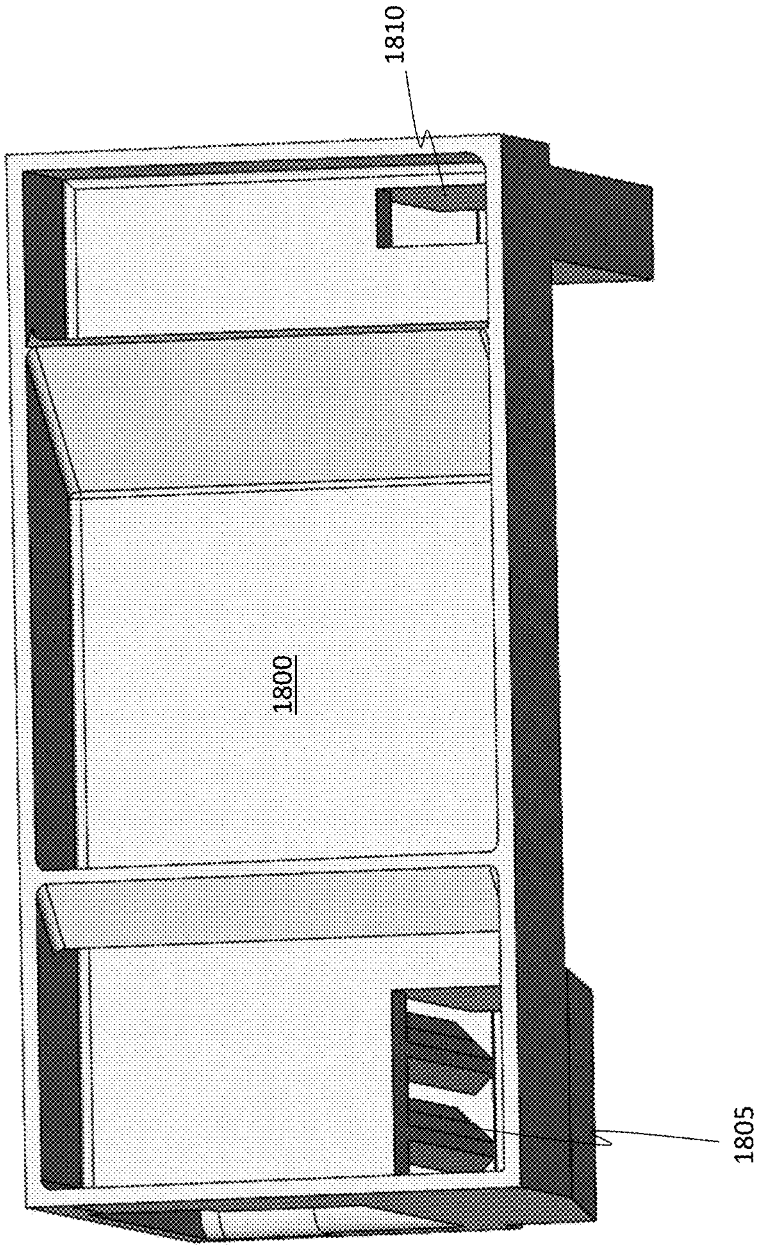
FIGS. 18A, 18B, and 18C depict an exemplary DUT shroud having a top exhaust port and internal vectored louvers for guiding air over the surface of an enclosed DUT (e.g., a memory device) to enhance cooling according to embodiments of the present invention.
Figure 18B:
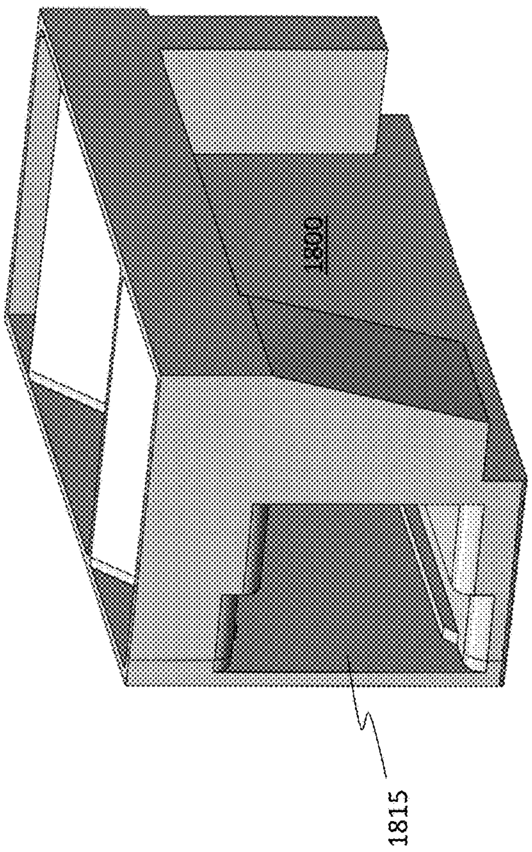
Figure 18C:
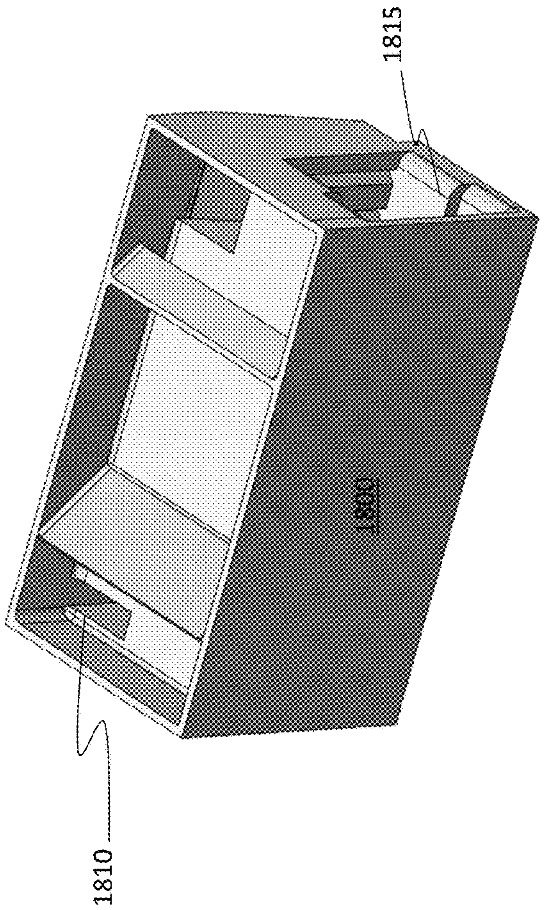

FIGS. 18A, 18B, and 18C depict an exemplary DUT shroud 1800 having a top exhaust port 1810 and internal vectored louvers 1805 for guiding air over the surface of an enclosed DUT (e.g., a memory device) to enhance cooling according to embodiments of the present invention. DUT shroud 1800 can be used to hold and enclose a DUT during use (e.g., device testing), and can be disposed in a DIB having an independently controllable multi-channel cooling system that cools the DUT using blown or forced air, according to embodiments. In the examples of FIGS. 18A, 18B, and 18C, DUT shroud 1800 includes a top exhaust port 1810 that allows hot air to escape upwards from DUT shroud, although the exhaust port can be located on any surface of DUT shroud 1800 depending on the DUT form factor, location and orientation of cooling fins, etc. Opening 1815 allows the DUT to be inserted into shroud 1800 and can function as an air entrainment opening, according to some embodiments.

In sum, the disclosed techniques overcome the limitations of traditional methods by independently controlling multiple cooling channels to cool multiple DUTs concurrently based on temperature measurements thereof. Traditional approaches to thermal management for DUT testing typically rely on a bank or array of fans integrated into a rack-mounted interface operating at a relatively constant speed to cool multiple DUTs, which can lead to inconsistent temperatures across the devices. The disclosed techniques, in contrast, can employ multiple fans that are controlled independently according to temperature information of the DUTs, which is typically measured by an internal temperature sensor disposed in the DUTs, and the air can be guided by a shroud or cover placed over the DUT that can include vectored louvres, internal ridges, fins, chambers, ducts, etc., for directing air across surfaces of the DUT to evenly and efficiently cool the DUT during testing, or during normal operation of the DUT, e.g., to maintain the DUT within a prescribed temperature range during normal operation for best-case performance.

At least one technical advantage of the disclosed techniques is that more granular thermal control is provided by using multiple independent cooling channels. Another technical advantage is the use of DUT shrouds, which help secure the DUTs during testing, and can advantageously direct air over surfaces of the DUT to improve cooling efficiency. The disclosed techniques further offer enhanced testing flexibility as different DUTs can be tested under different thermal conditions (e.g., one DUT can be stress tested while another DUT is tested under normal operating conditions).

1. In some embodiments, a device interface board (DIB) for testing a device under test, the DIB comprises a temperature sensor board, and a controller board, wherein the temperature sensor board is operable to receive temperature information, and wherein the controller board is operable to independently control the operation of a plurality of fans for cooling a plurality of devices under test (DUTs), and wherein further the plurality of DUTs are disposed in a plurality of shrouds and are further coupled to the DIB for testing thereof.
2. The DIB as described in clause 1, further comprising an LED bar that displays DUT status information according to the temperature information.
3. The DIB as described in clause 1 or 2, wherein each DUT of the plurality of DUTs is disposed in a respective shroud of said plurality of shrouds and wherein each respective shroud encloses a corresponding DUT and guides air over surfaces of the corresponding DUT to evenly cool the corresponding DUT during testing.
4. The DIB as described in clause 3, wherein the plurality of fans comprises two front-mounted fans for each DUT of the plurality of DUTs, and wherein the front-mounted fans blow air that is exhausted out of at least one of a top of the plurality of shrouds, and a bottom of the plurality of shrouds.
5. The DIB as described in clause 3, wherein the plurality of shrouds comprise a plurality of fins respectively disposed on an interior surface of the plurality of shrouds to guide air across the surfaces of the plurality of DUTs.
6. The DIB as described in clause 3, wherein the plurality of shrouds are composed of plastic and produced by a 3D printer.
7. The DIB as described in clause 1, wherein the plurality of DUTs comprises at least 16 DUTs.
8. The DIB as described in clause 1, wherein the plurality of fans are independently controllable via the controller board according to the temperature information and operable to cause the plurality of DUTs to reach a prescribed temperature.
9. The DIB as described in clause 1, wherein the plurality of fans are independently controlled by the controller board according to the temperature information, and wherein the temperature information comprises internal DUT temperature sensor information.
10. The DIB as described in clause 1, wherein the plurality of fans comprises two respective bottom-mounted fans for each DUT of the plurality of DUTs that provide updraft airflow to cool the plurality of DUTs.
11. The DIB as described in clause 1, wherein the plurality of fans comprises two respective top-mounted fans for each DUT of the plurality of DUTs that provide downdraft airflow to cool the plurality of DUTs.
12. The DIB as described in clause 1, wherein the plurality of shrouds comprise respective internal vectored louvers operable to direct air along respective surfaces of the plurality of DUTs.
13. The DIB as described in clause 12, wherein the plurality of DUTs comprise respective cooling fins disposed on the DUTs, and wherein the respective internal vectored louvers are operable to direct air along a length of the cooling fins.
14. The DIB as described in clause 12, wherein the internal vectored louvers are operable to split air between different respective surfaces of the plurality of DUTs.
15. In some embodiments, a method of thermal management for testing a plurality of devices under test (DUTs) comprises accessing temperature information of a plurality of DUTs, controlling a plurality of fans to cool the plurality of DUTs according to the temperature information, wherein each DUT of the plurality of DUTs is associated with at least one respective fan of the plurality of fans, and performing instructions of a test program to test the plurality of DUTs.
16. The method as described in clause 15, further comprising illuminating an LED bar to display DUT status information of the plurality of DUTs according to the temperature information during execution of said test program.
17. The method as described in clause 15, wherein each DUT of the plurality of DUTs are disposed in respective shrouds that enclose the plurality of DUTs and further comprising using the shrouds to guide air over surfaces of the plurality of DUTs to evenly cool the plurality of DUTs during testing.

18. The method as described in clause 17, wherein the plurality of fans comprises two respective front-mounted fans for each DUT of the plurality of DUTs, and further comprising using the front-mounted fans to blow air that is exhausted out of at least one of a top of the shrouds, and a bottom of the shrouds.

19. The method as described in clause 17, wherein the shrouds comprise fins disposed on an interior surface of the shrouds and further comprising using the fins to guide air across the surfaces of the DUTs.

20. The method as described in clause 17, wherein the plurality of DUTs comprise respective cooling fins disposed on the DUTs, and wherein the plurality of shrouds comprise a top exhaust port and internal vectored louvers operable to direct air along a length of the cooling fins.

21. In some embodiments, a method of thermal management for testing a plurality of devices under test (DUTs) comprises accessing temperature information of a plurality of DUTs, and controlling a plurality of fans using thermal control signals to cool the plurality of DUTs according to the temperature information using an independent thermal control (ITC) device interface board (DIB), the DIB comprising a temperature sensor board operable to provide the temperature information, and a controller board operable to send and receive the thermal control signals.

22. The method of clause 21, wherein the temperature sensor board is operable to receive temperature information form the plurality of DUTs, wherein the controller board is operable to independently control the operation of a plurality of fans for cooling the plurality of devices under test (DUTs), wherein the plurality of shrouds are formed to enclose the plurality of DUTs, and wherein the plurality of DUTs are coupled to the ITC DIB.

23. The method of clause 21, wherein the plurality of DUTs are disposed in respective external hard drive enclosures, and wherein the external hard drive enclosures comprise a respective independent cooling channel and a respective thermal feedback control system.

24. The method of clause 21, wherein the controlling a plurality of fans using thermal control signals comprises controlling some fans of the plurality of fans to perform stress testing, and controlling other fans of the plurality of fans to perform device testing under normal operating conditions.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. While the preceding is directed to embodiments of the present disclosure, other and further embodiments of the disclosure may be devised without departing from the basic scope thereof, and the scope thereof is determined by the claims that follow.

What is claimed is:

1. A device interface board (DIB) for testing a device under test, the DIB comprising:

a temperature sensor board; and a controller board, wherein the temperature sensor board is operable to receive temperature information, wherein the controller board is operable to independently control the operation of a plurality of fans for selectively cooling a plurality of devices under test (DUTs) to a plurality of respective temperatures, wherein each DUT of the plurality of DUTs is cooled independently from every other DUT of the plurality of DUTs, and wherein the plurality of DUTs are disposed in a plurality of shrouds, and are operatively coupled to the controller board of the DIB for testing thereof.

2. The DIB as described in claim 1, further comprising an LED bar that displays DUT status information according to the temperature information received by the temperature sensor board.

3. The DIB as described in claim 1, wherein each DUT of the plurality of DUTs is disposed in a respective shroud of said plurality of shrouds and wherein each respective shroud encloses a corresponding DUT and guides air over surfaces of the corresponding DUT to evenly cool the corresponding DUT during testing.

4. The DIB as described in claim 3, wherein the plurality of fans comprises two front-mounted fans for each DUT of the plurality of DUTs, and wherein the front-mounted fans blow air that is exhausted out of at least one of: a top of the plurality of shrouds; and a bottom of the plurality of shrouds.

5. The DIB as described in claim 3, wherein the plurality of shrouds comprise a plurality of fins respectively disposed on an interior surface of the plurality of shrouds to guide air across the surfaces of the plurality of DUTs.

6. The DIB as described in claim 3, wherein the plurality of shrouds are composed of plastic and produced by a 3D printer.

7. The DIB as described in claim 1, wherein the plurality of DUTs comprises at least 16 DUTs.

8. The DIB as described in claim 1, wherein the plurality of fans are independently controllable via the controller board according to the temperature information and operable to cause the plurality of DUTs to reach a prescribed temperature.

9. The DIB as described in claim 1, wherein the plurality of fans are independently controlled by the controller board according to the temperature information, and wherein the temperature information comprises internal DUT temperature sensor information.

10. The DIB as described in claim 1, wherein the plurality of fans comprises two respective bottom-mounted fans for each DUT of the plurality of DUTs that provide updraft airflow to cool the plurality of DUTs.

11. The DIB as described in claim 1, wherein the plurality of fans comprises two respective top-mounted fans for each DUT of the plurality of DUTs that provide downdraft airflow to cool the plurality of DUTs.

12. The DIB as described in claim 1, wherein the plurality of shrouds comprise respective internal vectored louvers operable to direct air along respective surfaces of the plurality of DUTs.

13. The DIB as described in claim 12, wherein the plurality of DUTs comprise respective cooling fins disposed on the DUTs, and wherein the respective internal vectored louvers are operable to direct air along a length of the cooling fins.

14. The DIB as described in claim 12, wherein the internal vectored louvers are operable to split air between different respective surfaces of the plurality of DUTs.

15. A method of thermal management for testing a plurality of devices under test (DUTs), the method comprising:

accessing temperature information of a plurality of DUTs;

controlling a plurality of fans to selectively cool the plurality of DUTs to a plurality of respective temperatures according to the temperature information, wherein each DUT of the plurality of DUTs is associated with at least one respective fan of the plurality of fans, wherein a first DUT of the plurality of DUTs is cooled independently from a second DUT of the plurality of DUTs; and performing a test on the plurality of DUTs, wherein the test is performed at the plurality of respective temperatures.

16. The method as described in claim 15, further comprising illuminating an LED bar to display DUT status information of the plurality of DUTs according to the temperature information during execution of test.

17. The method as described in claim 15, wherein each DUT of the plurality of DUTs are disposed in respective shrouds that enclose the plurality of DUTs and further comprising using the shrouds to guide air over surfaces of the plurality of DUTs to evenly cool the plurality of DUTs during testing.

18. The method as described in claim 17, wherein the plurality of fans comprises two respective front-mounted fans for each DUT of the plurality of DUTs, and further comprising using the front-mounted fans to blow air that is exhausted out of at least one of: a top of the shrouds; and a bottom of the shrouds.

19. The method as described in claim 17, wherein the shrouds comprise respective fins disposed on an interior surface of the shrouds and further comprising using the respective fins to guide air across the surfaces of the plurality of DUTs.

20. The method as described in claim 17, wherein the plurality of DUTs comprise respective cooling fins disposed on the plurality of DUTs, and wherein the shrouds comprise a top exhaust port and internal vectored louvers operable to direct air along a length of the cooling fins.

21. A method of thermal management for testing a plurality of devices under test (DUTs), the method comprising:

accessing temperature information of a plurality of DUTs; and controlling a plurality of fans using thermal control signals sent by a controller board to selectively cool the plurality of DUTs to a plurality of respective temperatures according to the temperature information using an independent thermal control (ITC) device interface board (DIB), the DIB comprising:

a temperature sensor board operable to provide the temperature information; and the controller board operable to send and receive the thermal control signals, wherein a first DUT of the plurality of DUTs is cooled independently from a second DUT of the plurality of DUTs.

22. The method of claim 21, wherein the temperature sensor board is operable to receive temperature information from the plurality of DUTs, wherein the controller board is operable to independently control the operation of a plurality of fans for cooling the plurality of devices under test (DUTs), wherein a plurality of shrouds are formed to enclose the plurality of DUTs, and wherein the plurality of DUTs are operatively coupled to controller board of the ITC DIB.

23. The method of claim 21, wherein the plurality of DUTs comprise solid state drives (SSDs) disposed in respective external hard drive enclosures, and wherein the external hard drive enclosures comprise a respective independent cooling channel and a respective thermal feedback control system, wherein the respective feedback control system comprises a controller to control the respective independent cooling channel.

24. The method of claim 21, wherein the controlling a plurality of fans using thermal control signals comprises:

controlling some fans of the plurality of fans to perform stress testing; and controlling other fans of the plurality of fans to perform device testing under normal operating conditions concurrently with the stress testing.

* * * * *